United States Patent
Lillywhite et al.

(12)

(10) Patent No.: US 10,404,205 B2
(45) Date of Patent: Sep. 3, 2019

(54) PORTABLE SOLAR PANEL SYSTEM

(71) Applicant: Goal Zero LLC, Bluffdale, UT (US)

(72) Inventors: Fred Lillywhite, Cottonwood Heights, UT (US); Norman L. Krantz, Draper, UT (US); Henry J. Howell, Herriman, UT (US); Keyvan Vasefi, Payson, UT (US); Walker Ford, Holladay, UT (US); Ryan M. Weese, Lehi, UT (US); Richard Evans, Hyrum, UT (US)

(73) Assignee: GOAL ZERO LLC, Bluffdale, UT (US)

( * ) Notice: Subject to any disclaimer, the term of this patent is extended or adjusted under 35 U.S.C. 154(b) by 160 days.

(21) Appl. No.: 15/226,454

(22) Filed: Aug. 2, 2016

(65) Prior Publication Data

US 2017/0040932 A1   Feb. 9, 2017

Related U.S. Application Data

(60) Provisional application No. 62/201,062, filed on Aug. 4, 2015, provisional application No. 62/201,100, filed
(Continued)

(51) Int. Cl.
*H02S 20/30* (2014.01)
*H02S 40/42* (2014.01)
(Continued)

(52) U.S. Cl.
CPC ............ *H02S 20/30* (2014.12); *G05F 1/67* (2013.01); *H01L 31/048* (2013.01); *H02J 3/383* (2013.01);
(Continued)

(58) Field of Classification Search
CPC .......... H02S 20/30; H02S 10/40; H02S 40/34; H02S 40/425; H02S 50/00; G05F 1/67; H02J 3/383; H02J 7/007; H02J 7/355
(Continued)

(56) References Cited

U.S. PATENT DOCUMENTS

| 5,701,067 A | * | 12/1997 | Kaji | .................. A45C 15/00 |
| | | | | 136/293 |
| D599,286 S | | 9/2009 | Horito et al. | |

(Continued)

FOREIGN PATENT DOCUMENTS

| CN | 1140341 A | 1/1997 |
| CN | 203416020 | 1/2014 |

(Continued)

OTHER PUBLICATIONS

International Search Report and Written Opinion for PCT Application No. PCT/IB2016/054656 dated Nov. 18, 2016. 14 pages.
(Continued)

*Primary Examiner* — Jayne L Mershon
(74) *Attorney, Agent, or Firm* — Foley & Lardner LLP

(57) ABSTRACT

A solar panel assembly includes a solar panel and a module releasably coupled to the solar panel. The solar panel includes a front surface, a rear surface, and a plurality of solar cells provided along the front surface. The plurality of solar cells are configured to absorb light energy from a light source to generate electrical power. The module includes a support that is selectively repositionable between a first orientation and a second orientation and a load device attached to the support and electrically coupled to the plurality of solar cells such that the module stores electrical energy produced by the plurality of solar cells.

20 Claims, 14 Drawing Sheets

Related U.S. Application Data on Aug. 4, 2015, provisional application No. 62/275,000, filed on Jan. 5, 2016.

(51) Int. Cl.

| | |
|---|---|
| *H02S 40/34* | (2014.01) |
| *H02S 10/40* | (2014.01) |
| *H02J 3/38* | (2006.01) |
| *H02J 7/00* | (2006.01) |
| *H02J 7/35* | (2006.01) |
| *H02S 50/00* | (2014.01) |
| *G05F 1/67* | (2006.01) |
| *H01L 31/048* | (2014.01) |

(52) U.S. Cl.
CPC ............. *H02J 7/007* (2013.01); *H02J 7/355* (2013.01); *H02S 10/40* (2014.12); *H02S 40/34* (2014.12); *H02S 40/425* (2014.12); *H02S 50/00* (2013.01); *H02J 7/0047* (2013.01); *H02J 7/0068* (2013.01); *H02J 2007/0062* (2013.01); *Y02E 10/50* (2013.01)

(58) Field of Classification Search
USPC ........................................ 136/245
See application file for complete search history.

(56) References Cited

U.S. PATENT DOCUMENTS

| | | | |
|---|---|---|---|
| D625,251 S | 10/2010 | Workman et al. | |
| 9,136,731 B2 | 9/2015 | Jain | |
| 9,249,995 B2 * | 2/2016 | Krantz | ................... F24J 2/5264 |
| 9,853,489 B2 | 12/2017 | He et al. | |
| 2007/0283987 A1 * | 12/2007 | Reyes | ..................... A45B 3/04 |
| | | | 135/16 |
| 2008/0122518 A1 | 5/2008 | Besser et al. | |
| 2009/0079412 A1 | 3/2009 | Kuo | |
| 2009/0284998 A1 | 11/2009 | Zhang et al. | |
| 2011/0290307 A1 | 12/2011 | Workman et al. | |
| 2012/0048340 A1 * | 3/2012 | Qadir | .................... G01S 3/7861 |
| | | | 136/246 |
| 2012/0138123 A1 | 6/2012 | Newdoll et al. | |
| 2012/0187897 A1 | 7/2012 | Lenk et al. | |
| 2012/0300440 A1 * | 11/2012 | Miyamae | ............ H01M 10/465 |
| | | | 362/183 |
| 2013/0134782 A1 | 5/2013 | Seon | |
| 2013/0234645 A1 * | 9/2013 | Goei | ..................... H02J 7/0052 |
| | | | 320/101 |
| 2014/0067149 A1 | 3/2014 | Chen et al. | |
| 2014/0257581 A1 | 9/2014 | Ishii et al. | |
| 2014/0265996 A1 * | 9/2014 | Djeu | ...................... H02J 7/025 |
| | | | 320/101 |
| 2015/0102762 A1 | 4/2015 | Goei et al. | |
| 2015/0207005 A1 | 7/2015 | Feng | |
| 2016/0102762 A1 | 4/2016 | Brennenstuhl et al. | |
| 2016/0218551 A1 | 7/2016 | Sano et al. | |

FOREIGN PATENT DOCUMENTS

| | | |
|---|---|---|
| KR | 101436019 | 9/2014 |
| WO | WO-2014/142753 | 9/2014 |

OTHER PUBLICATIONS

U.S. Appl. No. 12/945,583, filed Nov. 12, 2010, Workman et al.
U.S. Appl. No. 12/983,677, filed Jan. 3, 2011, Workman et al.
U.S. Appl. No. 15/226,454, filed Aug. 2, 2016, Goal Zero LLC.
U.S. Appl. No. 15/226,535, filed Aug. 2, 2016, Goal Zero LLC.
U.S. Appl. No. 29/535,211, filed Aug. 4, 2015, Krantz et al.
U.S. Appl. No. 29/550,562, filed Jan. 5, 2016, Goal Zero LLC.
U.S. Appl. No. 61/262,796, filed Nov. 19, 2009, Workman et al.
U.S. Appl. No. 61/335,463, filed Jan. 6, 2010, Workman et al.
U.S. Appl. No. 61/350,364, filed Jun. 1, 2010, Workman et al.
U.S. Appl. No. 61/734,050, filed Dec. 6, 2012, Norman et al.
U.S. Appl. No. 62/201,062, filed Aug. 4, 2015, Goal Zero LLC.
U.S. Appl. No. 62/201,100, filed Aug. 4, 2015, Goal Zero LLC.
U.S. Appl. No. 62/275,000, filed Jan. 5, 2016, Goal Zero LLC.
Chinese Office Action for Application No. 20161062958 dated Apr. 24, 2019. 11 pages.

* cited by examiner

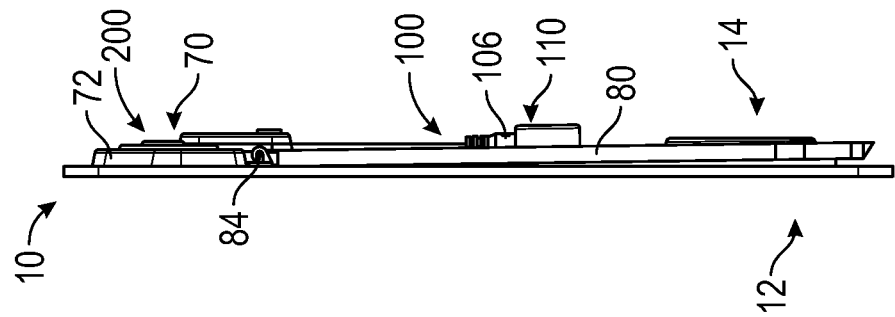
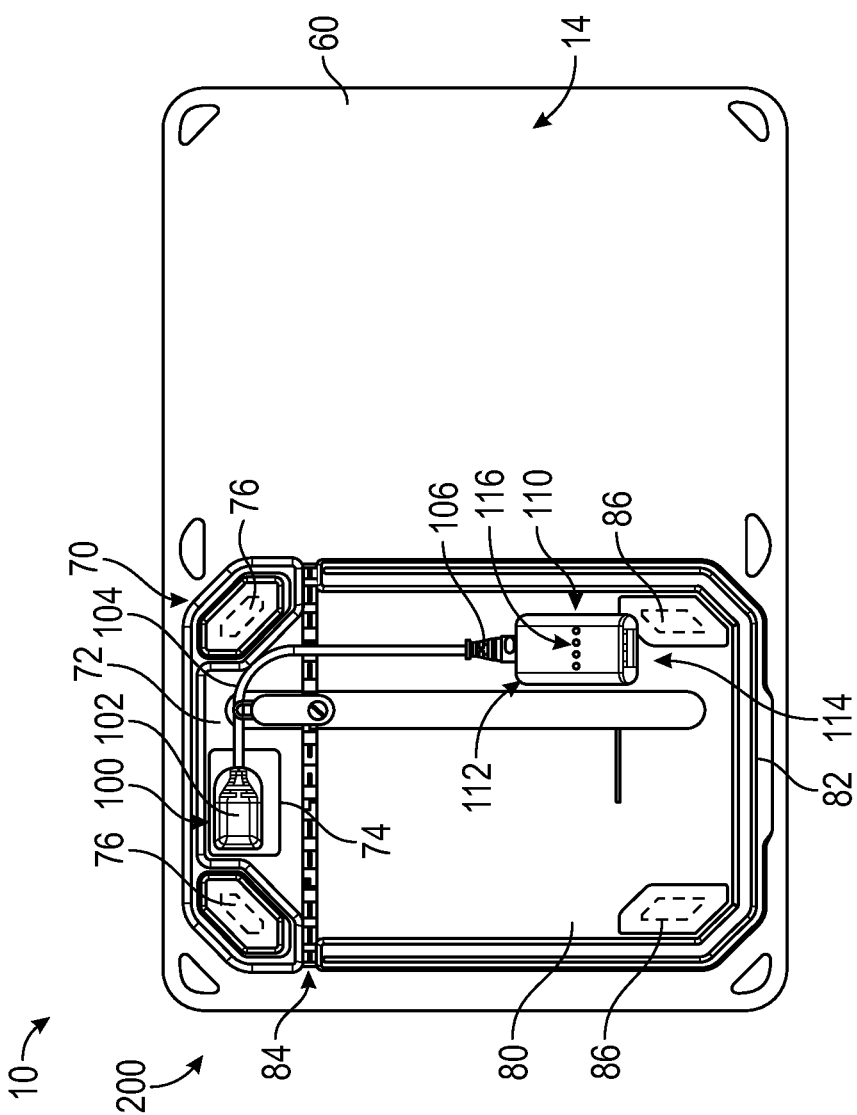

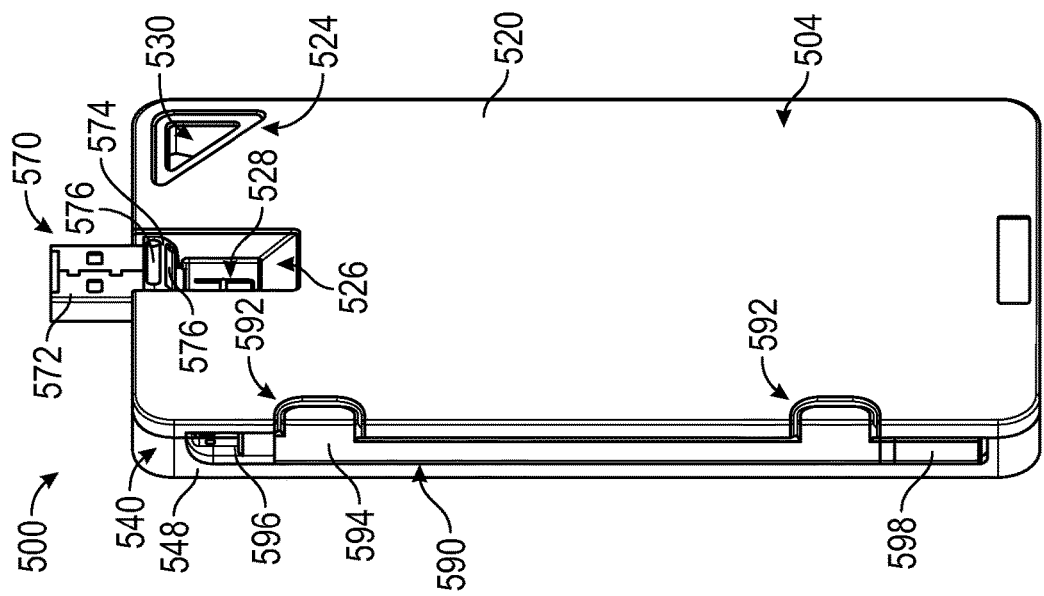
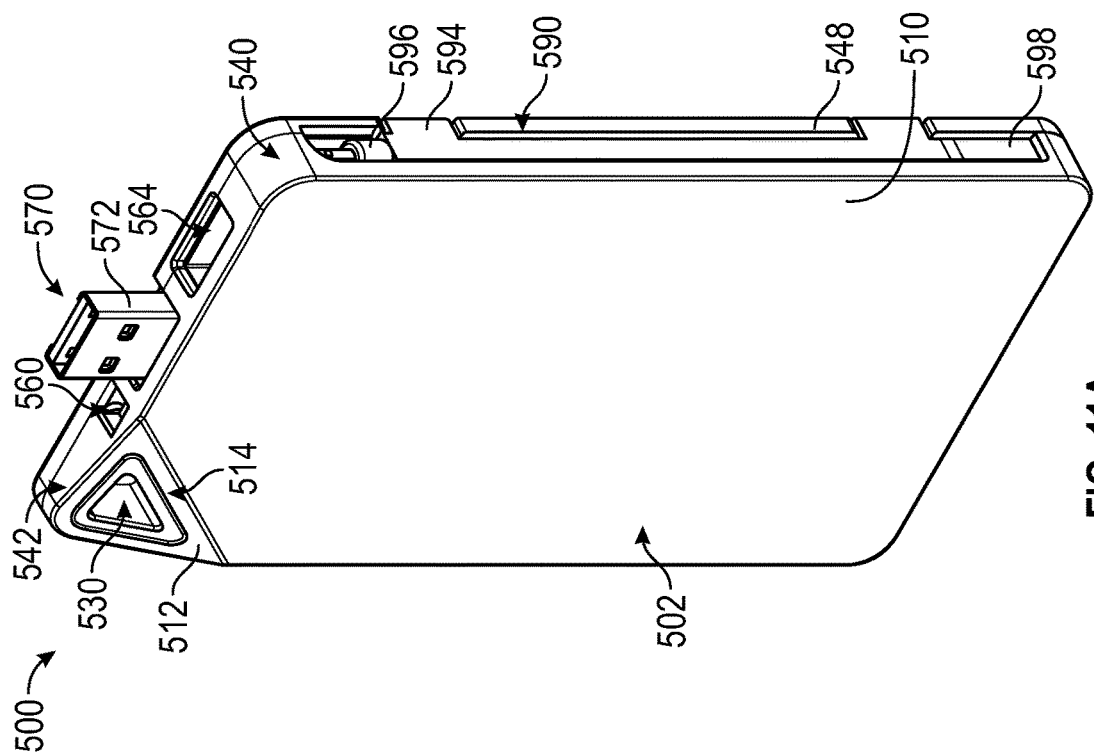

PORTABLE SOLAR PANEL SYSTEM

CROSS-REFERENCE TO RELATED PATENT APPLICATIONS

This application claims the benefit of U.S. Provisional Patent Application No. 62/201,062, filed Aug. 4, 2015, U.S. Provisional Patent Application No. 62/201,100, filed Aug. 4, 2015, and U.S. Provisional Patent Application No. 62/275,000, filed Jan. 5, 2016, all of which are incorporated herein by reference in their entireties.

BACKGROUND

A solar panel is a packaged assembly of photovoltaic cells. Solar panels use light energy (e.g., photons) from the sun to generate an electric current via the photovoltaic effect. A solar panel is typically used to generate and supply electricity to a load device or system. Solar panels are an environmentally-friendly alternative to other sources of energy such as coal, oil, or gasoline. Portable solar panels may be used in place of traditional portable power supply devices (e.g., generators, batteries).

SUMMARY

One exemplary embodiment relates to a solar panel assembly that includes a solar panel and a module releasably coupled to the solar panel. The solar panel includes a front surface, a rear surface, and a plurality of solar cells provided along the front surface. The plurality of solar cells are configured to absorb light energy from a light source to generate electrical power. The module includes a support that is selectively repositionable between a first orientation and a second orientation and a load device attached to the support and electrically coupled to the plurality of solar cells such that the module stores electrical energy produced by the plurality of solar cells.

Another exemplary embodiment relates to a solar panel assembly that includes a solar panel and a module coupled to the solar panel. The solar panel includes a front surface, a rear surface, and a plurality of solar cells provided along the front surface. The plurality of solar cells are configured to absorb light energy from a light source to generate electrical power. The module includes a load device at least one of selectively powered and selectively charged by the solar panel assembly, and the module defines a recess configured to releasably receive the load device such that the load device is selectively deployable with the solar panel and the module.

Still another exemplary embodiment relates to a solar panel assembly that includes a solar panel and a module releasably coupled to the solar panel. The solar panel includes a front surface, a rear surface, and a plurality of solar cells provided along the front surface. The plurality of solar cells are configured to absorb light energy from a light source to generate electrical power. The module includes a power output connector electrically coupled to the plurality of solar cells, the power output connector configured to selectively power at least one of a portable electronic device and a load device, and a leg that is selectively repositionable relative to the solar panel between a retracted orientation and an extended orientation, the leg propping the solar panel upright when selectively repositioned into the extended orientation.

The invention is capable of other embodiments and of being carried out in various ways. Alternative exemplary embodiments relate to other features and combinations of features as may be recited herein.

BRIEF DESCRIPTION OF THE DRAWINGS

The disclosure will become more fully understood from the following detailed description, taken in conjunction with the accompanying figures, wherein like reference numerals refer to like elements, in which:

FIGS. 6A-6B are various views of a solar panel assembly having a module selectively positioned in a retracted orientation, according to an exemplary embodiment;

FIGS. 11A-11E are various views of a load device of the solar panel assembly of FIG. 8, according to an exemplary embodiment.

DETAILED DESCRIPTION

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

According to the exemplary embodiment shown in FIGS. 1-5B, a solar panel assembly, shown as solar panel assembly 10, is configured to generate electrical power from incident light. The generated electrical power may be provided to at least one of charge and power a load device (e.g., a phone, a tablet, a computer, a portable and rechargeable battery pack, etc.). In one embodiment, the solar panel assembly 10 is configured (e.g., arranged, sized, etc.) to provide an output power of up to 7 watts ("W"). In another embodiment, the solar panel assembly 10 is configured to provide an output power of up to 14 W. In other embodiments, the solar panel assembly 10 is configured to provide still another output power (e.g., 10 W, 20 W, etc.). The power output of the solar panel assembly 10 may be related to a surface area thereof and/or a relative orientation between the solar panel assembly 10 and a light source (e.g., the sun, etc.). According to an exemplary embodiment, the solar panel assembly 10 is lightweight and portable.

Figure 1:
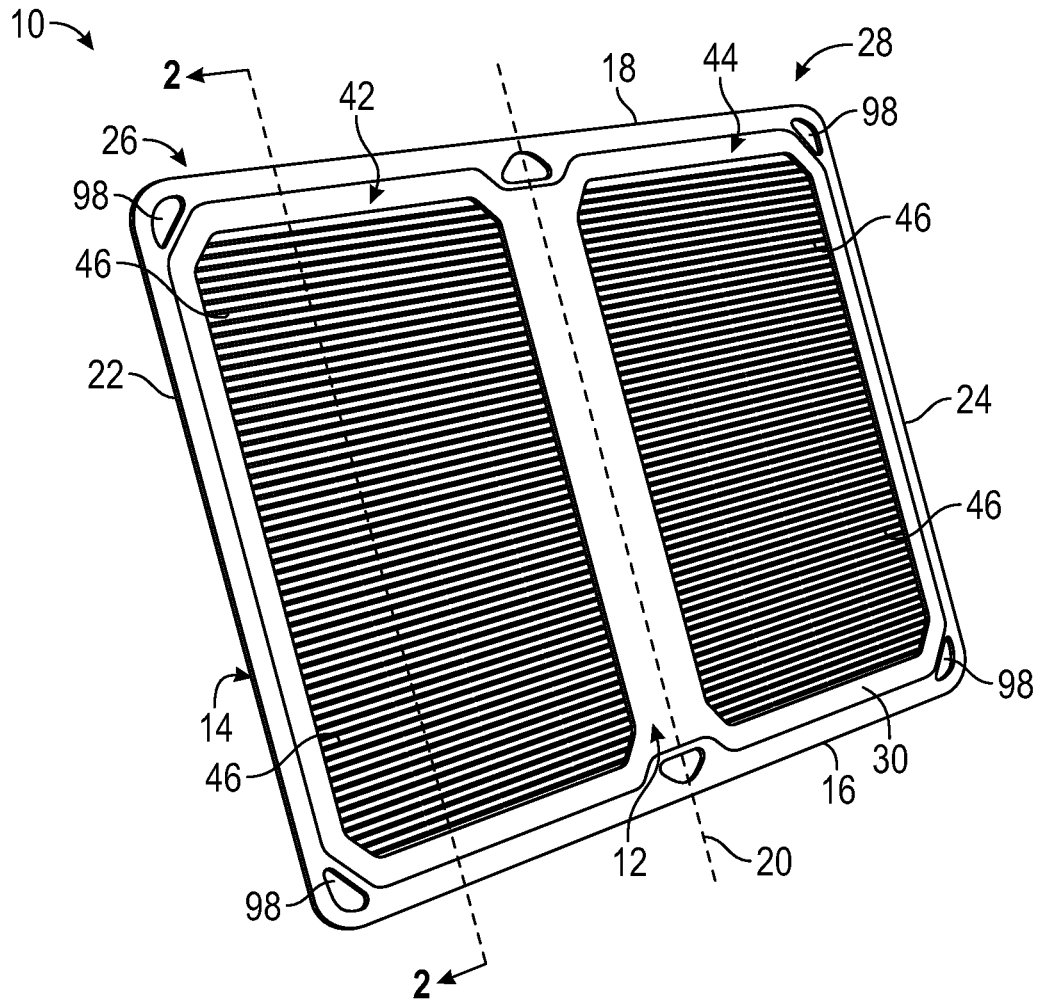
FIG. 1 is a front perspective view of a solar panel assembly, according to an exemplary embodiment.
Figure 2:
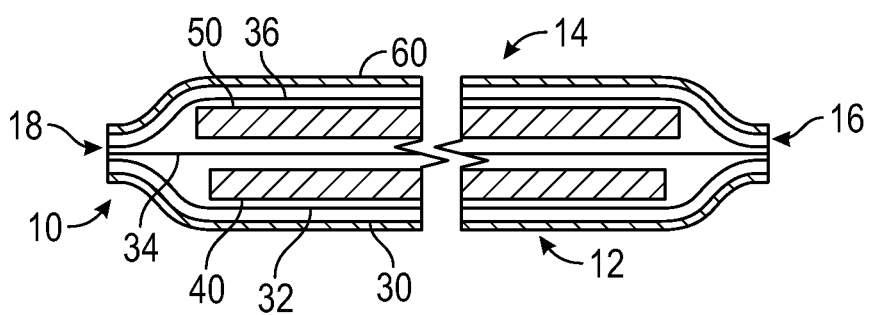
FIG. 2 is a cross-sectional view of the solar panel assembly of FIG. 1, according to an exemplary embodiment.
Figure 3:
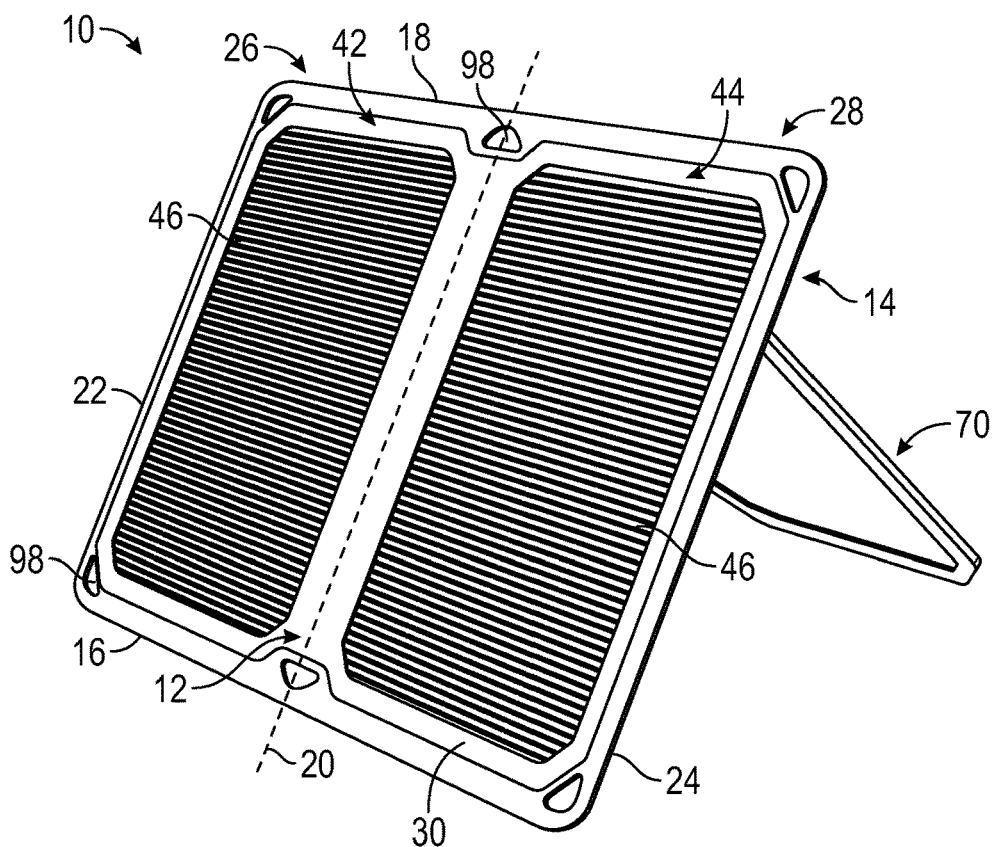
FIG. 3 is another front perspective view of the solar panel assembly of FIG. 1, according to an exemplary embodiment.

As shown in FIGS. 1-3, the solar panel assembly 10 includes a first surface, shown as front surface 12, and an opposing second surface, shown as rear surface 14. The front surface 12 is separated from the rear surface 14 by a thickness of the solar panel assembly 10, according to an exemplary embodiment. The solar panel assembly 10 has a first edge, shown as bottom edge 16, and an opposing second edge, shown as top edge 18. The bottom edge 16 is separated from the top edge 18 by a height of the solar panel assembly 10, according to an exemplary embodiment. As shown in FIGS. 1 and 3, the solar panel assembly 10 has a first end, shown as left end 22, and an opposing second end, shown as right end 24. The left end 22 is separated from the right end 24 by a width of the solar panel assembly 10, according to an exemplary embodiment. As shown in FIGS. 1 and 3, the bottom edge 16, the top edge 18, the left end 22, and the right end 24 define a generally-rectangular shape of the solar panel assembly 10. In alternative embodiments, the solar panel assembly 10 is otherwise shaped (e.g., square, circular, hexagonal, etc.). As shown in FIGS. 1 and 3, the solar panel assembly 10 defines an axis, shown as axis 20. The axis 20 is vertical and equidistantly positioned between the left end 22 and the right end 24, according to an exemplary embodiment. According to an exemplary embodiment, the axis 20 divides the solar panel assembly 10 into a first side, shown as left side 26, and a second side, shown as right side 28.

Figure 5A:
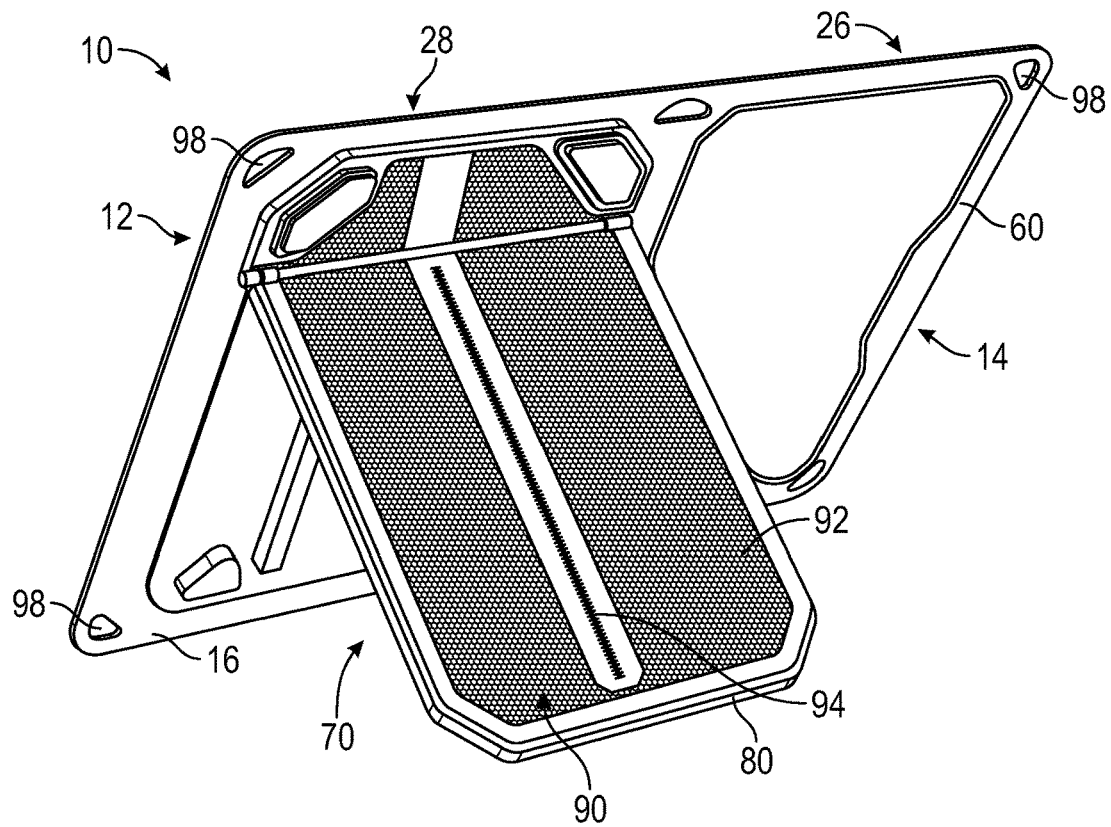
FIG. 5A is a rear perspective view of the solar panel assembly of FIG. 1 with a support thereof selectively positioned in an extended orientation, according to an exemplary embodiment.
Figure 5B:
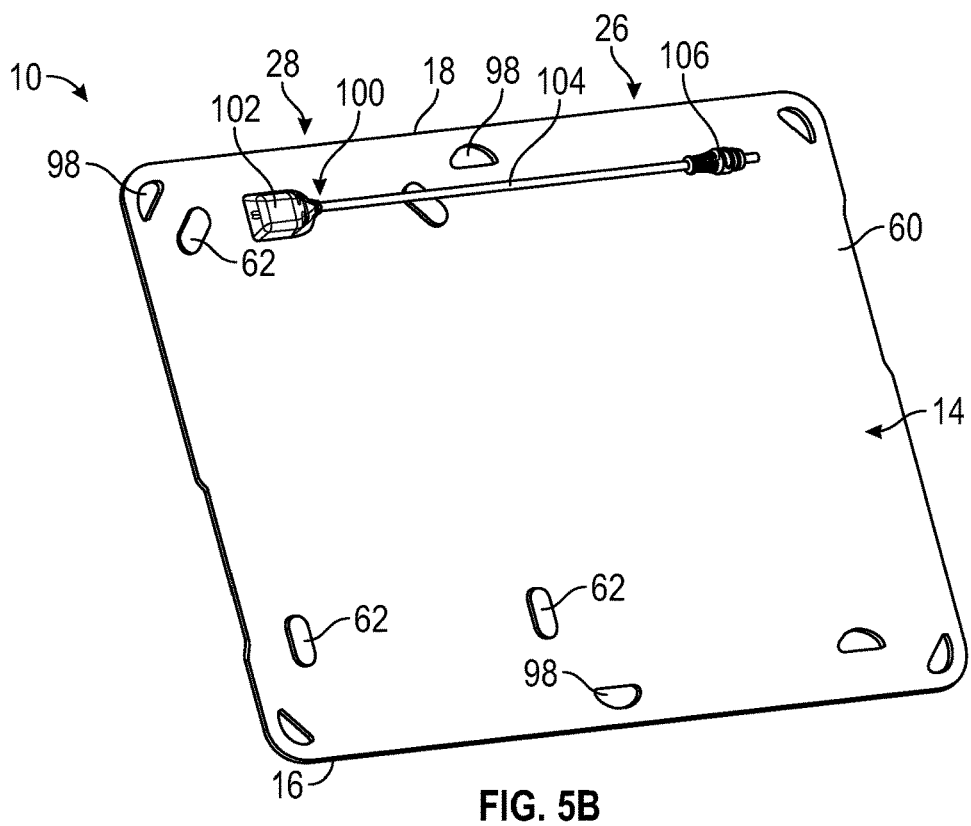
FIG. 5B is a rear perspective view of the solar panel assembly of FIG. 5A without a support, according to an exemplary embodiment.

According to the exemplary embodiment shown in FIGS. 1-3 and 5A-5B, the solar panel assembly 10 is constructed of multiple layers. As shown in FIGS. 1-3, the solar panel assembly 10 includes a first layer, shown as cover layer 30. As shown in FIG. 2, the solar panel assembly 10 includes a second layer, shown as solar cell layer 40. A third layer, shown as structural layer 50, is provided as part of the solar panel assembly 10, according to an exemplary embodiment. As shown in FIGS. 2 and 5A-5B, the solar panel assembly 10 includes a fourth layer, shown as cover layer 60.

As shown in FIG. 2, the cover layer 30 is disposed along the front surface 12 of the solar panel assembly 10. In one embodiment, the cover layer 30 defines the front surface 12 of the solar panel assembly 10. According to an exemplary embodiment, the cover layer 30 is and/or includes a clear plastic film. The cover layer 30 may be configured to protect the other layers of the solar panel assembly 10 (e.g., the solar cell layer 40, the structural layer 50, etc.) from foreign materials (e.g., dirt, debris, fluids, etc.). According to an exemplary embodiment, the cover layer 30 is flexible.

As shown in FIG. 2, the cover layer 30 is disposed along the solar cell layer 40. In one embodiment, the solar cell layer 40 is disposed beneath the cover layer 30. According an exemplary embodiment, the solar cell layer 40 includes one or more silicon wafers. The one or more silicon wafers may be electrically coupled to one another (e.g., in series, in parallel, both in series and in parallel, etc.) to provide the performance described herein.

As shown in FIG. 2, an adhesive layer, shown as adhesive layer 32, is disposed between the cover layer 30 and the solar cell layer 40. The adhesive layer 32 couples the cover layer 30 and the solar cell layer 40. In one embodiment, the adhesive layer 32 includes a sheet of an adhesive material that is applied between the cover layer 30 and the solar cell layer 40. In another embodiment, the adhesive layer 32 includes a material (e.g., a glue or other adhesive, etc.) that is applied (e.g., in liquid form, etc.) to at least one of the cover layer 30 and the solar cell layer 40. The adhesive layer 32 may cure, dry, and/or set (e.g., thermally set in response to an applied thermal energy, etc.), among other alternatives, to couple the cover layer 30 and the solar cell layer 40.

As shown in FIGS. 1 and 3, the solar cell layer 40 includes a plurality of solar cells 46 arranged into a first solar panel, shown as left solar panel 42, and a second solar panel, shown as right solar panel 44. According to an exemplary embodiment, the solar cells 46 are configured to receive and convert solar power (e.g., light energy, etc.) from a light source (e.g., the sun, etc.) to generate electrical power. According to an exemplary embodiment, the left solar panel 42 and the right solar panel 44 are spaced a distance apart. In another embodiment, the solar cell layer 40 includes solar cells 46 arranged into a single solar panel that extends an entire width across the front surface 12. In still another embodiment, the solar cell layer 40 includes solar cells 46 arranged into one or more solar panels that are still otherwise arranged (e.g., four solar panels arranged in a two-by-two array, etc.).

As shown in FIG. 2, the structural layer 50 is disposed along the solar cell layer 40. In one embodiment, the structural layer 50 is positioned beneath the solar cell layer 40. According to an exemplary embodiment, the structural layer 50 is positioned within only a portion of the solar panel assembly 10. By way of example, the structural layer 50 may be positioned in a targeted zone of the solar panel assembly 10 (e.g., behind the solar cells 46, etc.). According an exemplary embodiment, the structural layer 50 includes a printed circuit board ("PCB"). The PCB may include a substrate (e.g., a non-conductive substrate, etc.) configured to mechanically support the solar cells 46. The PCB may also electrically couple the solar cells 46 (e.g., using conductive tracks, pads, and/or other features etched or otherwise formed into sheets that include copper or another material laminated onto the substrate, etc.). According to an exemplary embodiment, the structural layer 50 includes a first PCB positioned to correspond with the left solar panel 42 and a second PCB positioned to correspond with the right solar panel 44 (e.g., such that the first PCB and the second PCB are also spaced a distance apart, etc.). As shown in FIG. 2, the structural layer 50 may include PCBs that are sized and/or shaped (e.g., trimmed, cut, constructed, etc.) based on the size and/or shape of the solar cells 46 of the solar panel assembly 10. In one embodiment, the PCBs are sized and/or shaped to be only slightly larger (e.g., in width, in height, etc.) than the solar cells 46 and/or the solar panels. A solar panel assembly 10 having such PCBs may be flexible (e.g., foldable, etc.) while still including solar cells 46 and/or solar panels that are fully supported.

As shown in FIG. 2, an adhesive layer, shown as adhesive layer 34, is disposed between the solar cell layer 40 and the structural layer 50. The adhesive layer 34 couples the solar cell layer 40 and the structural layer 50. In one embodiment, the adhesive layer 34 includes a sheet of an adhesive material that is applied between the solar cell layer 40 and the structural layer 50. In another embodiment, the adhesive layer 34 includes a material (e.g., a glue or other adhesive, etc.) that is applied (e.g., in liquid form, etc.) to at least one of the solar cell layer 40 and the structural layer 50. The adhesive layer 34 may cure, dry, and/or set (e.g., thermally set in response to an applied thermal energy, etc.), among other alternatives, to couple the solar cell layer 40 and the structural layer 50.

As shown in FIG. 2, the cover layer 60 is disposed along the structural layer 50. According to an exemplary embodiment, the cover layer 60 is disposed along and coupled directly to the cover layer 30 within specified regions of the solar panel assembly 10 (e.g., between the left solar panel 42 and the right solar panel 44, along the bottom edge 16 and/or the top edge 18 of the solar panel assembly 10, etc.). The cover layer 60 may define the rear surface 14 of the solar panel assembly 10. According to an exemplary embodiment, the cover layer 60 is manufactured using plastic, leather, Kevlar, cloth, suede, or any combination thereof. In still other embodiments, cover layer 60 includes still another material. The cover layer 60 may be configured to protect the other layers of the solar panel assembly 10 (e.g., the solar cell layer 40, the structural layer 50, etc.) from foreign materials (e.g., dirt, debris, fluids, etc.). According to an exemplary embodiment, the cover layer 60 is flexible. The cover layer 60 may also contribute to the aesthetic look and feel of the solar panel assembly 10.

As shown in FIG. 2, an adhesive layer, shown as adhesive layer 36, is disposed between the structural layer 50 and the cover layer 60. The adhesive layer 36 couples the structural layer 50 and the cover layer 60. In one embodiment, the adhesive layer 36 includes a sheet of an adhesive material that is applied between the structural layer 50 and the cover layer 60. In another embodiment, the adhesive layer 36 includes a material (e.g., a glue or other adhesive, etc.) that is applied (e.g., in liquid form, etc.) to at least one of the structural layer 50 and the cover layer 60. The adhesive layer 36 may cure, dry, and/or set (e.g., thermally set in response to an applied thermal energy, etc.), among other alternatives, to couple the structural layer 50 and the cover layer 60. As shown in FIG. 2, the at least one of the adhesive layer 32, the adhesive layer 34, and the adhesive layer 36 are configured to couple a portion (e.g., the edges, the sides, the outer periphery, etc.) of the cover layer 30 and the cover layer 60 together, thereby forming a portion of the structure of the solar panel assembly 10.

As shown in FIGS. 1 and 3-5B, the solar panel assembly 10 defines a plurality of apertures, shown as through holes 98. Solar panel assembly 10 may be supported using (e.g., hung by, etc.) and/or support other devices (e.g., provide a hanging point for, etc.) using the through holes 98. By way of example, the through holes 98 may facilitate coupling the solar panel assembly 10 to a backpack, belt, or other structure (e.g., using a clasp, rope, a zip-tie, etc.). In the embodiment shown in FIGS. 1 and 3-5B, the through holes 98 are spaced around the periphery of the solar panel assembly 10. According to an exemplary embodiment, the solar panel assembly 10 includes a reinforcement (e.g., Kevlar ring, a metal grommet, etc.) positioned around and/or defining at least one of the through holes 98.

Figure 4:
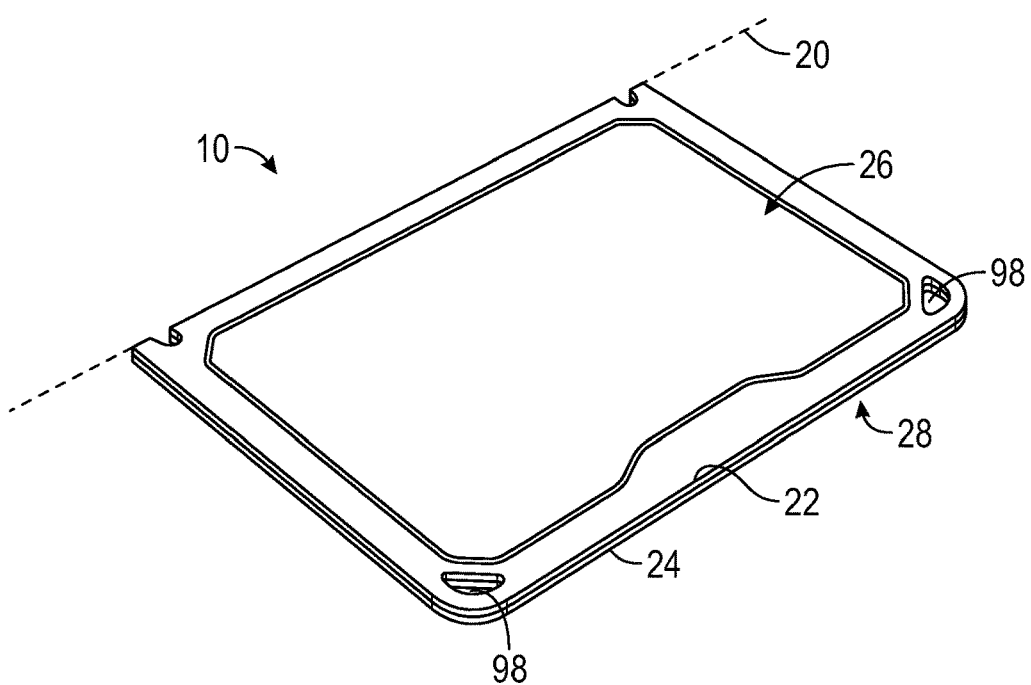
FIG. 4 is a perspective view of the solar panel assembly of FIG. 1 in a folded configuration, according to an exemplary embodiment.

As shown in FIG. 4, the solar panel assembly 10 is selectively reconfigurable (e.g., foldable, etc.) about the axis 20 into a folded orientation. In one embodiment, the left end 22 of the left side 26 and the right end 24 of the right side 28 of the solar panel assembly 10 meet when the solar panel assembly 10 is arranged into the folded orientation. The foldable solar panel assembly 10 may be stored in smaller areas and/or more easily transported by a user (e.g., carried, etc.) relative to traditional solar panel assemblies. According to an exemplary embodiment, the solar panel assembly 10 has increased flexibility due to at least one of the flexibility of the cover layer 30 and/or the cover layer 60, the spacing of the left solar panel 42 and the right solar panel 44 of the solar cell layer 40, and the spacing of the first PCB and the second PCB of the structural layer 50. Such flexibility facilitates folding the solar panel assembly 10 about the axis 20. In an alternative embodiment, the left side 26 and the right side 28 are rotatably coupled with a hinge mechanism about which the solar panel assembly 10 folds. According to an exemplary embodiment, the left side 26 and the right side 28 include corresponding fasteners (e.g., embedded magnets, hook and loop fasteners, clips, etc.) positioned (e.g., along the left end 22 and the right end 24, etc.) to releasably couple the left side 26 and the right side 28.

According to the exemplary embodiment shown in FIGS. 3 and 5A, the solar panel assembly 10 includes a module, shown as module 70. The module 70 may be configured to support the solar panel assembly 10. As shown in FIG. 5A, the module 70 includes a support (e.g., frame, leg, kickstand, etc.), shown as kickstand 80. The kickstand 80 includes a storage compartment, shown as storage pocket 90, according to the embodiment of FIG. 5A. The kickstand 80 is rotatably coupled to a base portion of the module 70, according to an exemplary embodiment. The kickstand 80 may thereby pivot away from the rear surface 14 to adjust an angle at which the solar panel assembly 10 is oriented. According to an exemplary embodiment, changing the orientation angle of the solar panel assembly 10 changes (e.g., increases, decreases, etc.) the intensity of the solar energy incident upon the solar panel assembly 10. In some embodiments, the kickstand 80 is vented. Such venting may facilitate heat transfer (e.g., convective heat transfer, etc.) from a device (e.g., a load device, etc.) disposed within the storage pocket 90. As shown in FIG. 5A, the storage pocket 90 is partially defined by a mesh layer 92 coupled to a backing plate of the kickstand 80. The mesh layer 92 and the backing plate of the kickstand 80 define a cavity there between. According to an exemplary embodiment, a load device (e.g., a phone, a battery pack, etc.) may be disposed within the cavity of the storage pocket 90. The mesh layer 92 provides ventilation through the cavity and thereby reduces the risk of overheating the load device. The storage pocket 90 is closable using a fastener, shown as zipper 94. The zipper 94 is configured to facilitate accessing the cavity defined between the kickstand 80 and the mesh layer 92. In other embodiments, another type of fastener is provided (e.g., hook and loop fasteners, magnets, etc.) to facilitate selectively closing the storage pocket 90.

Figure 7A:
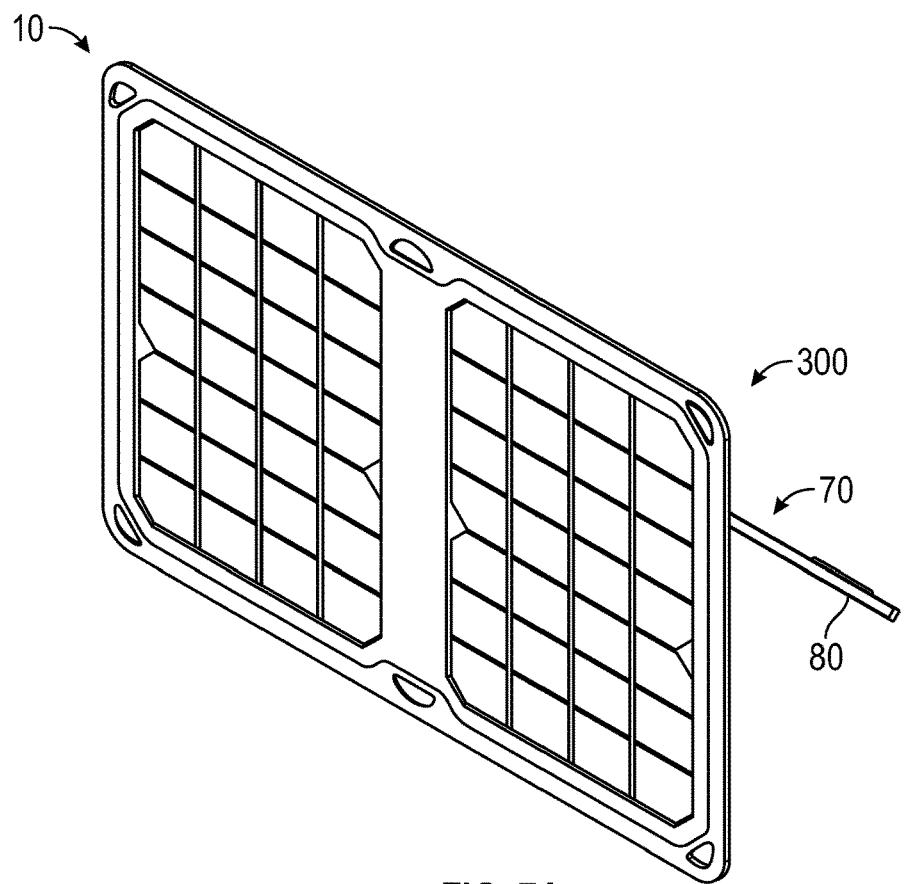
FIGS. 7A-7C are various views of a solar panel assembly having a module selectively positioned in an extended orientation, according to an exemplary embodiment.
Figure 7B:
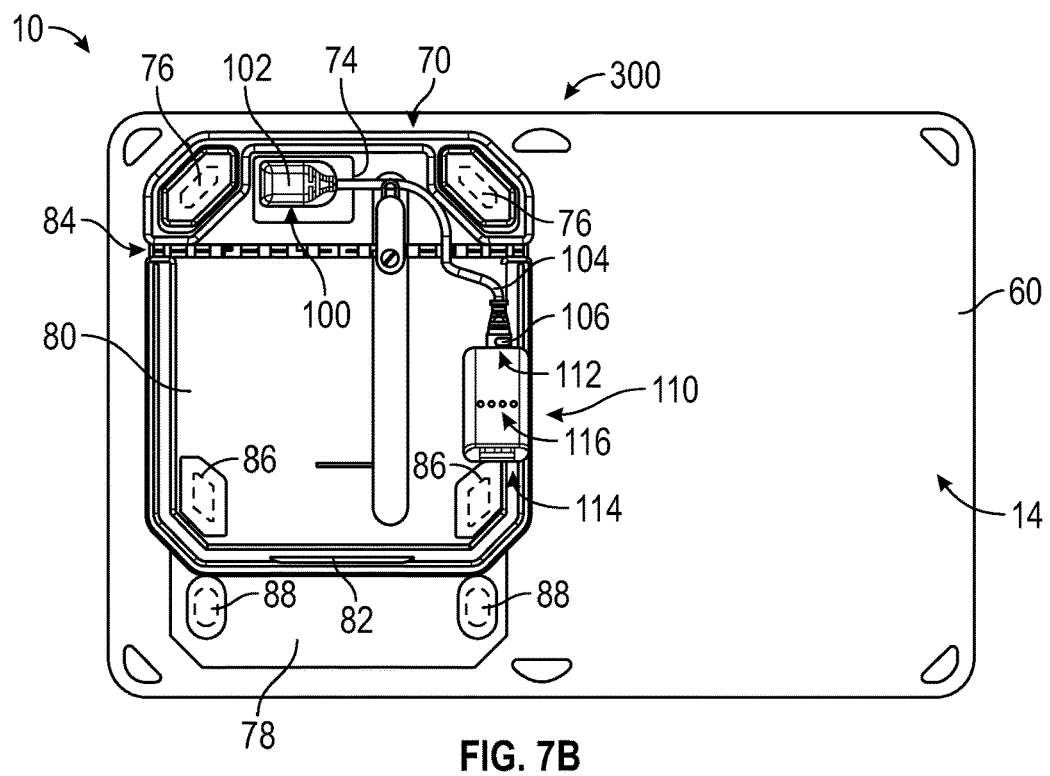
Figure 7C:
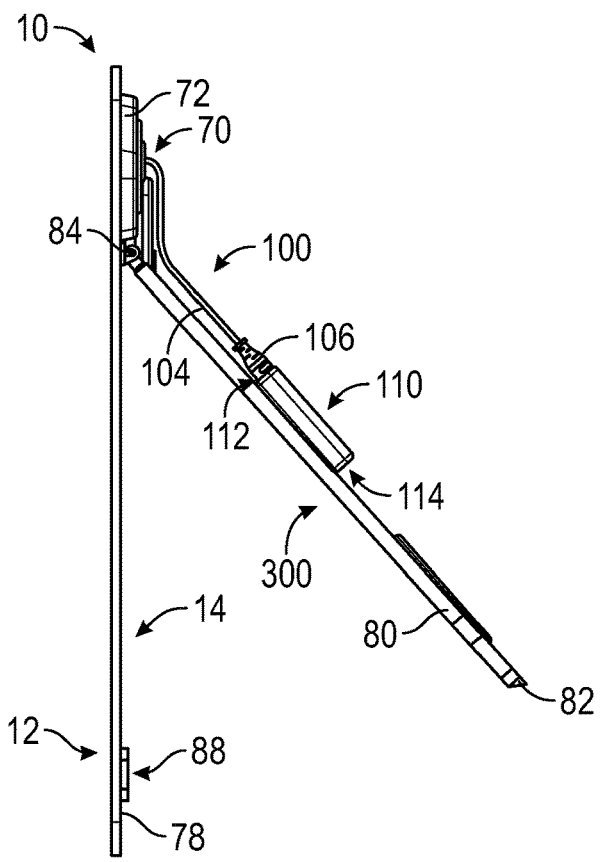

According to the exemplary embodiment shown in FIGS. 6A-7C, the module 70 of the solar panel assembly 10 is selectively reconfigurable between a first orientation, shown as retracted orientation 200, and a second orientation, shown as extended orientation 300. As shown in FIGS. 6A-6B, the module 70 is selectively reconfigured in the retracted orientation 200. With module 70 selectively reconfigured in the retracted orientation 200, the kickstand 80 is retracted, according to an exemplary embodiment. As shown in FIGS. 7A-7C, the module 70 is selectively reconfigured in the extended orientation 300. With module 70 selectively reconfigured in the extended orientation 300, the kickstand 80 is extended (e.g., pivoted, spaced away from the rear surface 14, etc.), according to an exemplary embodiment. By way of example, the solar panel assembly 10 having the kickstand 80 selectively repositionable away from the rear surface 14 may facilitate heat transfer (e.g., convective heat transfer, etc.) from at least one of the solar panel assembly 10 and a load device coupled to the solar panel assembly 10 and/or positioned within the storage pocket 90. The solar panel assembly 10 may thereby prevent the load device from overheating, in some embodiments aided by airflow through mesh layer 92. As shown in FIGS. 6A and 7B-7C, the kickstand 80 includes an edge, shown as edge 82. The edge 82 is configured to engage a support surface (e.g., a ground surface, etc.) and prop the solar panel assembly 10 upright. In one embodiment, the edge 82 has a width selected to provide a larger contact surface for the kickstand 80 when in the extended orientation 300 and in engagement with a support surface. The edge 82 may have a width that is less than or equal to an overall width of the module 70.

As shown in FIGS. 6A-6B and 7B-7C, the module 70 includes a base portion, shown as base 72. The kickstand 80 is pivotably coupled to the base 72 with a hinge, shown as hinge 84. In other embodiments, the kickstand 80 is still otherwise pivotably coupled to the base 72. According to an exemplary embodiment, the hinge 84 facilitates the rotation of the kickstand 80 away from the rear surface 14 of the solar panel assembly 10.

According to an exemplary embodiment, the module 70 is removably coupled to the rear surface 14. In one embodiment, the module 70 is magnetically coupled to the rear surface 14. As shown in FIGS. 6A and 7B, the base 72 of the module 70 includes a plurality of magnets 76. As shown in FIG. 5B, the rear surface 14 includes a plurality of coupling elements, shown as coupling elements 62, positioned and/or configured to correspond with the magnets 76 provided with the base 72 of the module 70. According to an exemplary embodiment, the coupling elements 62 include a material (e.g., an embedded material, a material disposed along the rear surface 14, etc.) to which the magnets 76 attract (e.g., metals such as iron, nickel, steel, etc.). The attraction between the magnets 76 of the base 72 and the coupling elements 62 associated with the rear surface 14 detachably couples the module 70 to the rear surface 14. In other embodiments, the rear surface 14 includes a plurality of magnets, and the module 70 includes at least one magnet and/or a material to which magnets are attracted and positioned and/or configured in a corresponding manner. The module 70 may be coupled to the rear surface 14 with still other magnets and/or materials that magnets are attracted to. Such other magnets and/or materials may be positioned in various locations. In other embodiments, another form of coupler and/or fastener is used to detachably couple the base 72 of the module 70 to the rear surface 14 (e.g., clips, zipper, hook and loop, etc.). The module 70 may be detached from the rear surface 14, thereby reducing the weight of the solar panel assembly 10. The solar panel assembly 10 may thereby be reconfigured into a lightweight product without jeopardizing functionality. A lightweight solar panel assembly 10 may be particularly important for users seeking to rely on the lightweight solar panel assembly 10 (e.g., during a backpacking trip, etc.).

As shown in FIGS. 7B-7C, the module 70 includes a backer, shown as backer 78. In one embodiment, the backer 78 is affixed (e.g., adhesively secured, etc.) to the rear surface 14. In other embodiments, the backer 78 is removably coupled to the rear surface 14 (e.g., magnetically coupled, etc.). The base 72 of the module 70 may be removably coupled to the backer 78. By way of example, the base 72 of the module 70 may be magnetically coupled to the backer 78. The kickstand 80 is removably coupled to the backer 78, according to an exemplary embodiment. As shown in FIGS. 7B-7C, the backer 78 of the module 70 includes a plurality of magnets, shown as magnets 88. According to an exemplary embodiment, the magnets 88 removably couple the kickstand 80 to the backer 78. As shown in FIGS. 6A and 7B, the kickstand 80 includes a plurality of magnets, shown as magnets 86. According to an exemplary embodiment, the magnets 86 are positioned and/or configured to correspond with the magnets 88. In other embodiments, the kickstand 80 includes a material to which the magnets 88 are attracted. In still other embodiments, the kickstand 80 includes the magnets 86, and the backer 78 includes a material to which the magnets 88 are attracted. The attraction between the magnets 86 and the magnets 88 selectively restricts the kickstand 80 from pivoting about the hinge 84 (e.g., requires an external force, etc.). In other embodiments, different types of fasteners are used to selectively couple the kickstand 80 to the backer 78 (e.g., clips, hook and loop, etc.).

As shown in FIGS. 5B-6B and 7B-7C, the solar panel assembly 10 includes an output, shown as output 100, coupled to an output module, shown as output module 110. The output 100 is configured to couple the output module 110 to the solar cells 46 of the solar panel assembly 10, according to an exemplary embodiment. The output module 110 may couple a load device (e.g., a smartphone, cell phone, battery pack, tablet, personal computer, laptop, smartwatch, etc.) to the solar panel assembly 10. In an alternative embodiment, the output 100 is configured to directly couple the load device to the solar panel assembly 10 (e.g., bypassing the output module 110, in embodiments where the solar panel assembly 10 does not include the output module 110, etc.). In some embodiments, the output 100 and/or the output module 110 are disposed within the cavity of the storage pocket 90.

As show in FIGS. 5B, 6A, and 7B-7C, the output 100 includes a module, shown as panel module 102, that is coupled to the output module 110 with a cable, shown as cable 104. The panel module 102 is configured to couple the output module 110 to the solar cells 46 of the solar panel assembly 10, according to an exemplary embodiment. In one embodiment, the cable 104 is hard wired into the panel module 102. In other embodiments, the cable 104 is removably coupled to the panel module 102 (e.g., with corresponding male and female connectors, etc.). As shown in FIGS. 6A and 7B-7C, the cable 104 is coupled to the output module 110 with a connector, shown as output connector 106. In one embodiment, the cable 104 is configured to couple the panel module 102 with the output connector 106. The output connector 106 may be configured to couple the panel module 102 to at least one of the output module 110 and the load device. As shown in FIGS. 6A and 7B, the base 72 of the module 70 defines an aperture, shown as cutout 74. The cutout 74 receives the panel module 102 (e.g., when the module 70 is coupled to the rear surface 14, etc.), according to an exemplary embodiment.

As show in FIGS. 6A and 7B-7C, the output module 110 includes an input, shown as input interface 112, and an output, shown as output interface 114. According to an exemplary embodiment, the output connector 106 includes a male connector (e.g., a barrel plug, etc.), and the input interface 112 includes a female connector configured to interface with and receive the output connector 106. In an alternative embodiment, the output connector 106 includes a female connector and the input interface 112 includes a male connector. According to an exemplary embodiment, the output interface 114 includes a female connector. In one embodiment, the female connector of the output interface 114 is a female USB interface configured to receive a male USB connector (e.g., of a charging and/or power cable for the load device, etc.). In an alternative embodiment, the output interface 114 is a male connector (e.g., a lightning connector, a 30-pin connector, a micro USB, a mini USB, etc.).

The output module 110 may thereby be detachably coupled to the solar cells 46. The output module 110 may receive power from the solar cells 46 and at least one of power and charge a load device (e.g., coupled to output interface 114, etc.). Solar panel assembly 10 having an output module 110 that is releasably coupled to the panel module 102 may be upgraded (e.g., with new and/or redesigned output modules 110, etc.) by unplugging the existing output module 110 and replacing it with a different output module 110. In an alternative embodiment, the cable 104 is hard wired to the output module 110.

As show in FIGS. 6A and 7B, the output module 110 includes a display, shown as display 116. According to an exemplary embodiment, the display 116 is configured to indicate the intensity of the solar energy incident upon the front surface 12 of to the solar panel assembly 10 (e.g., providing a power flow indicator, etc.). According to an exemplary embodiment, the display 116 includes a plurality of LEDs. By way of example, as the solar intensity increases, the number of LEDs of the display 116 that illuminate may increase, providing an indication as to the solar intensity. In an alternative embodiment, the display 116 is or includes a digital display or any other type of display that provides an indication of the solar intensity. According to an exemplary embodiment, the display 116 is positioned such that a user of the solar panel assembly 10 may see the intensity of the incident solar energy and reorient the solar panel assembly 10 (e.g., rotate the solar panel assembly 10, adjust the angle of the kickstand 80, change the panel-to-sun placement, etc.) to achieve a maximum power output from the solar panel assembly 10.

According to the exemplary embodiment shown in FIGS. 8-11E, the solar panel assembly 10 includes a module, shown as module 400, having a load device, shown as battery pack 500. The battery pack 500 may store electrical power generated by the solar panel assembly 10 for later use. In other embodiments, the load device is a cell phone, a smart phone, a tablet, or still another device. The module 400 may be configured to support the solar panel assembly 10 (e.g., prop the solar panel assembly 10 upright, at an angle, etc.). As shown in FIGS. 9-10C and 10E-10G, the module 400 includes a support, shown as kickstand 440, having a first side, shown as exterior side 442, and an opposing second side, shown as interior side 444. The kickstand 440 is rotatably coupled to a base portion of the module 400, according to an exemplary embodiment. The kickstand 440 may thereby pivot away from the rear surface 14 to adjust an angle at which the solar panel assembly 10 is oriented. According to an exemplary embodiment, changing the orientation angle of the solar panel assembly 10 changes (e.g., increases, decreases, etc.) the intensity of the solar energy incident upon the solar panel assembly 10 and the power generated thereby.

Figure 8:
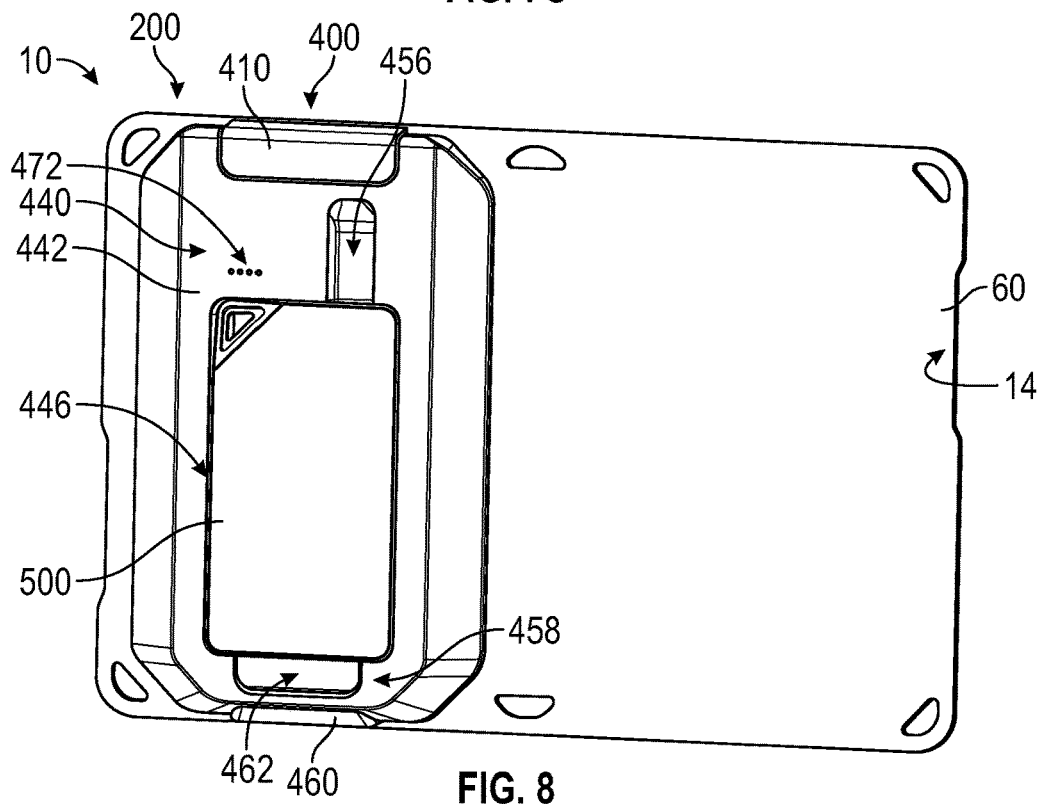
FIG. 8 is a rear perspective view of a solar panel assembly with a module thereof selectively positioned in a retracted orientation, according to another exemplary embodiment.
Figure 9:
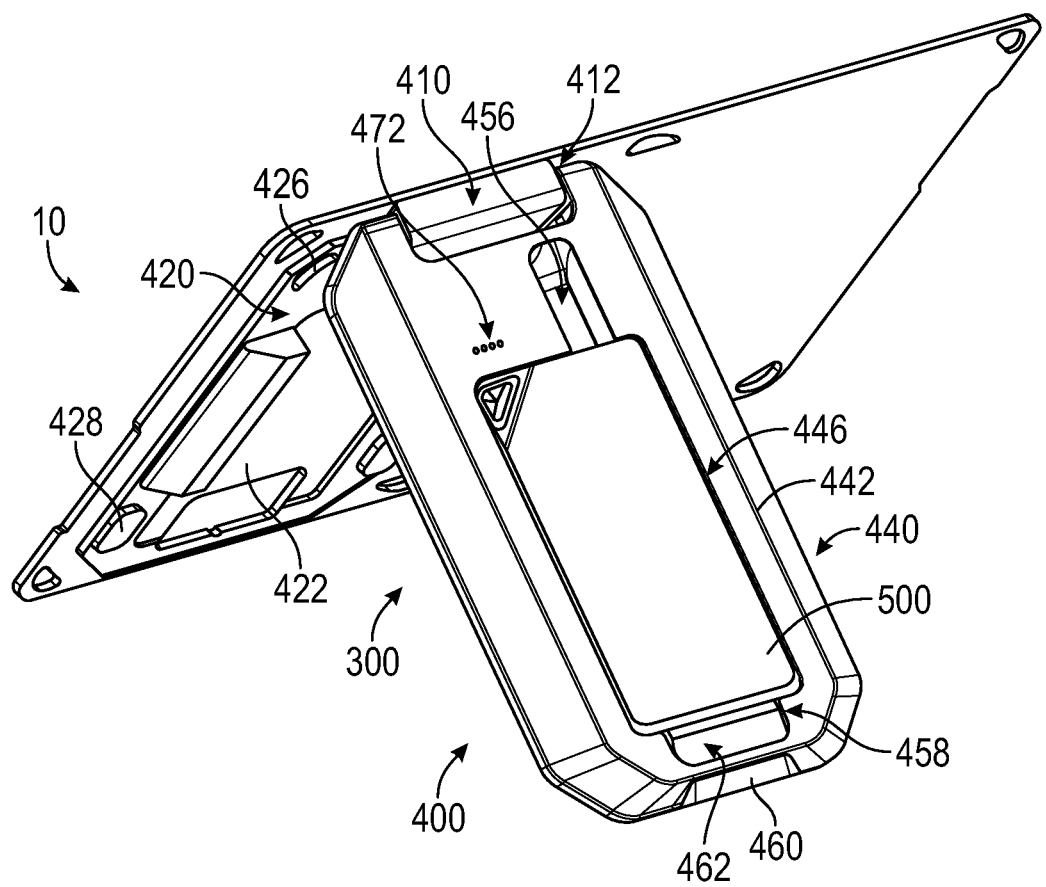
FIG. 9 is a rear perspective rear view of the solar panel assembly of FIG. 8 with the module selectively positioned in an extended orientation, according to an exemplary embodiment.

As shown in FIGS. 8-9, the module 400 of the solar panel assembly 10 is selectively reconfigurable between the retracted orientation 200 and the extended orientation 300. As shown in FIG. 8, the module 400 is selectively reconfigured in the retracted orientation 200. With module 400 selectively reconfigured in the retracted orientation 200, the kickstand 440 is retracted, according to an exemplary embodiment. As shown in FIG. 9, the module 400 is selectively reconfigured in the extended orientation 300. With module 400 selectively reconfigured in the extended orientation 300, the kickstand 440 is extended (e.g., pivoted outward, spaced away from the rear surface 14, etc.), according to an exemplary embodiment. By way of example, the solar panel assembly 10 having the kickstand 440 selectively repositionable away from the rear surface 14 may facilitate heat transfer (e.g., convective heat transfer, etc.) from at least one of the solar panel assembly 10, the battery pack 500, and/or another load device coupled to the solar panel assembly 10. The solar panel assembly 10 may thereby prevent the load device from overheating. As shown in FIGS. 8-10A, 10C, and 10F, the kickstand 440 includes an edge, shown as edge 460. The edge 460 is configured to engage a support surface (e.g., a ground surface, etc.) and prop the solar panel assembly 10 upright. In one embodiment, the edge 460 has a width selected to provide a larger contact surface for the kickstand 440 when in the extended orientation 300 and in engagement with a support surface. The edge 460 may have a width that is less than or equal to an overall width of the module 400.

As shown in FIGS. 8-10G, the module 400 includes a base portion, shown as base 410. The kickstand 440 is pivotably coupled to the base 410 with a hinge, shown as hinge 412. In other embodiments, the kickstand 440 is otherwise pivotably coupled to the base 410. According to an exemplary embodiment, the hinge 412 facilitates the rotation of the kickstand 440 away from the rear surface 14 of the solar panel assembly 10. In one embodiment, the hinge 412 limits rotation of the kickstand 440 to less than or equal to forty-five degrees from the rear surface 14. In other embodiments, the hinge 412 limits rotation of the kickstand 440 to not more than another limit (e.g., sixty, seventy-five, etc. degrees).

According to an exemplary embodiment, the module 400 is removably coupled to the rear surface 14. In one embodiment, the module 400 is magnetically coupled to the rear surface 14. As shown in FIGS. 9-10G, the module 400 includes a backer, shown as backer 420, having a first side, shown as front side 422, and an opposing second side, shown as rear side 424. In one embodiment, the backer 420 is removably coupled to the rear surface 14 (e.g., magnetically coupled, etc.). In other embodiments, the backer 420 is affixed (e.g., adhesively secured, etc.) to the rear surface 14. As shown in FIGS. 9-10G, the backer 420 of the module 400 includes a plurality of first coupling elements, shown as upper magnets 426, and a plurality of second coupling elements, shown as lower magnets 428. In alternative embodiments, the first coupling elements and/or the second coupling elements of the backer 420 are materials to which magnets are attracted (e.g., iron, steel, etc.). According to an exemplary embodiment, the upper magnets 426 and/or the lower magnets 428 are positioned and/or configured to correspond with the coupling elements 62 of the solar panel assembly 10. The attraction between the upper magnets 426 and/or the lower magnets 428 of the backer 420 and the coupling elements 62 associated with the rear surface 14 detachably couples the module 400 to the rear surface 14 when the rear side 424 of the backer 420 is disposed along the rear surface 14. In other embodiments, the rear surface 14 includes a plurality of magnets, and the backer 420 includes at least one of a magnet and/or a material to which magnets are attracted that is positioned and/or configured in a corresponding manner. The backer 420 may be coupled to the rear surface 14 with still other magnets and/or materials to which magnets are attracted. Such other magnets and/or materials may be positioned in various locations. In other embodiments, another form of coupler and/or fastener is used to detachably couple the backer 420 of the module 400 to the rear surface 14 (e.g., clips, zipper, hook and loop, etc.). The module 400 may be detached from the rear surface 14, thereby reducing the weight of the solar panel assembly 10. The solar panel assembly 10 may thereby be reconfigured into a lightweight product without jeopardizing functionality. A lightweight solar panel assembly 10 may be particularly important for users seeking to rely on the lightweight solar panel assembly 10 (e.g., during a backpacking trip, etc.).

The kickstand 440 is removably coupled to the backer 420, according to an exemplary embodiment. As shown in FIGS. 10F-10G, the kickstand 440 of the module 400 includes a plurality of coupling elements, shown as magnets 468, disposed on the interior side 444 of the kickstand 440 that removably couple the kickstand 440 to the front side 422 of the backer 420. According to an exemplary embodiment, the magnets 468 are positioned and/or configured to correspond with the lower magnets 428 of the backer 420. In other embodiments, the kickstand 440 includes a material to which the lower magnets 428 are attracted (e.g., steel, iron, etc.). In still other embodiments, the kickstand 440 includes the magnets 468, and the backer 420 includes a material to which the magnets 468 are attracted. The attraction between the magnets 468 and the lower magnets 428 selectively restricts the kickstand 440 from pivoting about the hinge 412 (e.g., requires an external force, etc.). In other embodiments, different types of fasteners are used to selectively couple the kickstand 440 to the backer 420 (e.g., clips, hook and loop, etc.).

Figure 11D:
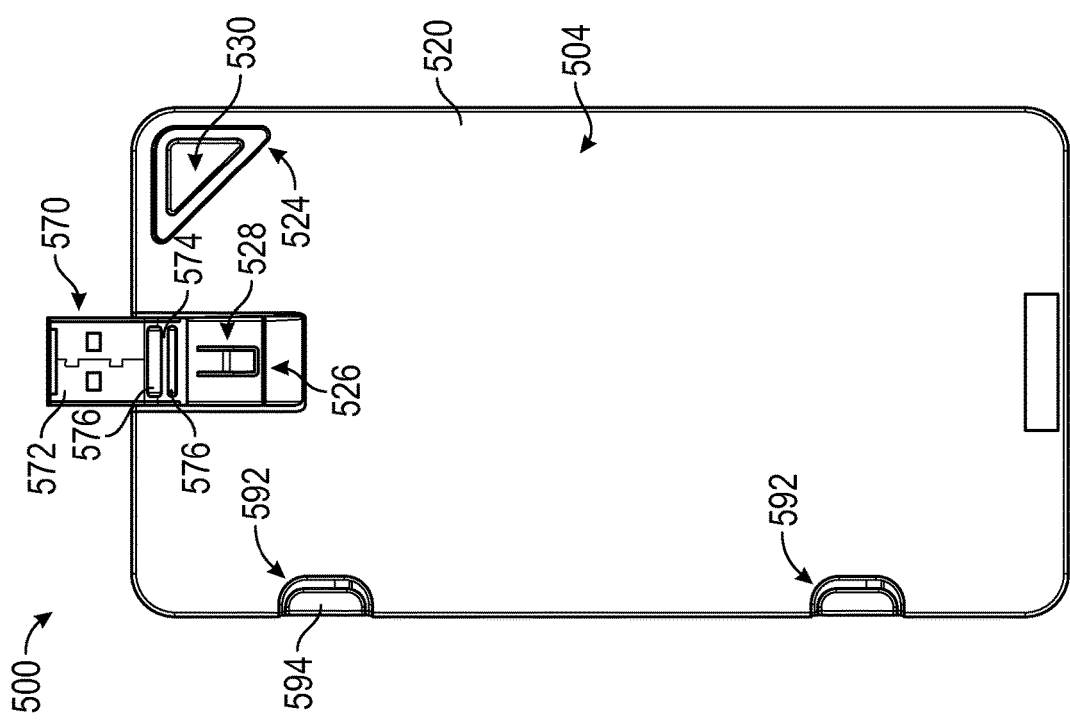
Figure 11C:
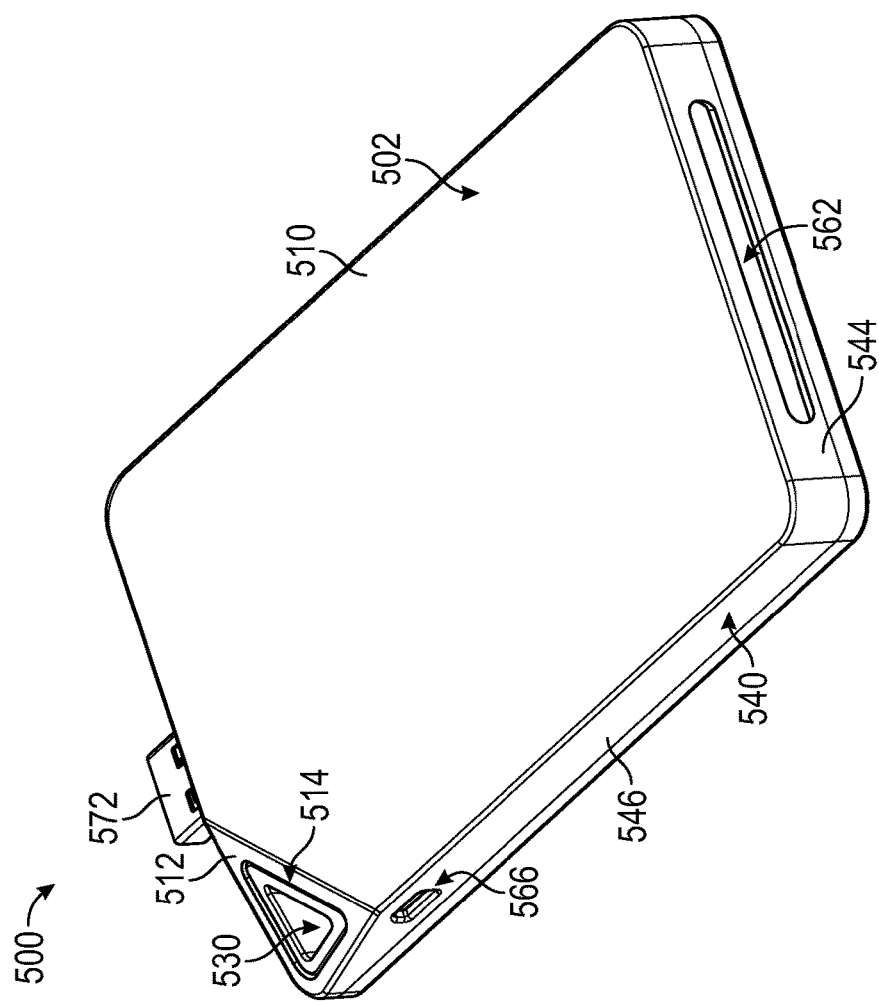

As shown in FIGS. 11A-11D, the battery pack 500 has a first side, shown as front side 502, and an opposing second side, shown as rear side 504. As shown in FIGS. 11A and 11C, the front side 502 include a first surface, shown as front face 510. As shown in FIGS. 11B and 11D, the rear side 504 includes an opposing second surface, shown as rear face 520. As shown in FIGS. 11A-11D, the battery pack 500 has a sidewall, shown as peripheral edge 540, that extends around the periphery of the battery pack 500 and connects the front face 510 to the rear face 520. The peripheral edge 540 includes a first lateral surface, shown as top edge 542, an opposing second lateral surface, shown as bottom edge 544, a first longitudinal surface, shown as right edge 548, and an opposing second longitudinal surface, shown as left edge 546. According to the exemplary embodiment, the peripheral edge 540 of the battery pack 500 is rectangular in shape. In other embodiments, the battery pack 500 is otherwise shaped (e.g., square, triangular, circular, cylindrical, n-polygon, etc.).

As shown in FIGS. 11A and 11C, the front face 510 of the battery pack 500 includes an indented portion that defines an angled face 512. As shown in FIG. 11A, the angled face 512 is positioned at one corner of the battery pack 500 (e.g., the top left corner thereof, etc.). In other embodiments, the battery pack 500 does not include the angled face 512, and the entire front face 510 is substantially flat. As shown in FIGS. 11A and 11C, the angled face 512 defines an aperture, shown as front aperture 514. As shown in FIGS. 11B and 11D, the rear face 520 of the battery pack 500 defines an aperture, shown as rear aperture 524, positioned to correspond with the front aperture 514. As shown in FIGS. 11A-11D, the front aperture 514 and the rear aperture 524 cooperatively define a through hole, shown as through hole 530. According to an exemplary embodiment, the through hole 530 is configured to facilitate coupling the battery pack 500 to a key chain, a carabiner or other clasp (e.g., to couple the battery pack 500 to a back pack, a garment, etc.), or still other coupling members.

As shown in FIG. 11A, the top edge 542 defines an aperture, shown as retaining aperture 560. In other embodiments, the retaining aperture 560 is otherwise positioned about the peripheral edge 540 (e.g., along the bottom edge 544, the right edge 548, the left edge 546, etc.). As shown in FIG. 11C, the bottom edge 544 defines a slot, shown as retaining slot 562. In other embodiments, the retaining slot 562 is otherwise positioned about the peripheral edge 540 (e.g., along the top edge 542, the right edge 548, the left edge 546, etc.). According to an exemplary embodiment, the retaining aperture 560 and/or the retaining slot 562 facilitate selectively securing the battery pack 500 to and/or within a cavity of the module 400.

According to an exemplary embodiment, the battery pack 500 includes one or more inputs configured to facilitate charging the battery pack 500 and one or more outputs configured to facilitate charging and/or powering an electronic device (e.g., a smart phone, a laptop, a tablet, a light source, etc.). As shown in FIG. 11A, the battery pack 500 includes a first output, shown as output interface 564, positioned along the top edge 542. In other embodiments, the output interface 564 is otherwise positioned (e.g., along the bottom edge 544, the right edge 548, the left edge 546, the front face 510, the rear face 520, etc.). According to an exemplary embodiment, the output interface 564 includes a female connector. In one embodiment, the female connector of the output interface 564 is a female USB connector configured to receive a male USB connector (e.g., of a charging and/or power cable for the load device, etc.). In other embodiments, the female connector of the output interface 564 is another type of female connector (e.g., a female micro USB connector, a female mini USB connector, etc.). In an alternative embodiment, the output interface 564 is a male connector (e.g., a lightning connector, a 30-pin connector, a male micro USB connector, a male mini USB connector, etc.).

As shown in FIG. 11C, the battery pack 500 includes a second output, shown as output interface 566, positioned along the left edge 546. In other embodiments, the output interface 566 is otherwise positioned (e.g., along the top edge 542, the bottom edge 544, the left edge 546, the front face 510, the rear face 520, etc.). According to an exemplary embodiment, the output interface 566 includes a female connector. In one embodiment, the female connector of the output interface 566 is a female micro USB connector configured to receive a male micro USB connector (e.g., of a charging and/or power cable for the load device, etc.). In other embodiments, the female connector of the output interface 566 is another type of female connector (e.g., a female USB connector, a female mini USB connector, etc.). In an alternative embodiment, the output interface 566 is a male connector (e.g., a lightning connector, a 30-pin connector, a male micro USB connector, a male mini USB connector, etc.). In some embodiments, the battery pack 500 does not include at least one of the output interface 564 and the output interface 566. In some embodiments, the battery pack 500 includes additional outputs (e.g., three, four, etc.). The additional outputs may be the same as or different than the output interface 564 and/or the output interface 566.

As shown in FIGS. 11A-11E, the battery pack 500 includes an input, shown as input interface 570, including a connector, shown as male connector 572. As shown in FIGS. 11A-11E, the male connector 572 is positioned along the top edge 542. In other embodiments, the input interface 570 is otherwise positioned (e.g., along the bottom edge 544, the right edge 548, the left edge 546, the front face 510, the rear face 520, etc.). In one embodiment, the male connector 572 of the input interface 570 is a male USB connector configured to interface with a female USB connector (e.g., of a computer, of a wall charger, of the solar panel assembly 10, etc.). In other embodiments, the male connector 572 is another type of male connector (e.g., a lightning connector, a 30-pin connector, a male micro USB connector, a male mini USB connector, etc.). In alternative embodiments, the input interface 570 includes a female connector (e.g., a female USB connector, a female micro USB connector, a female mini USB connector, etc.).

As shown in FIGS. 11A-11B, the right edge 548 defines a cavity, shown as recess 590. The rear face 520 defines a plurality of notches, shown as notches 592, that cooperate with the recess 590, according to an exemplary embodiment. The recess 590 and the notches 592 are configured to receive and store a cable assembly, shown as cable 594. The cable 594 facilitates powering an electronic device with the battery pack 500, according to an exemplary embodiment. The cable 594 includes a first connector, shown as first male connector 596, and a second connector, shown as second male connector 598. In other embodiments, at least one of the first male connector 596 and the second male connector 598 are replaced with a female connector. According to an exemplary embodiment, the second male connector 598 is configured to correspond with at least one of the output interface 564 and the output interface 566. In one embodiment, the second male connector 598 is a male USB connector configured to interface with a female USB connector of the battery pack 500 (e.g., the output interface 564, etc.). In other embodiments, the second male connector 598 is a male micro USB connector configured to interface with a female micro USB connector of the battery pack 500 (e.g., the output interface 566, etc.). In still other embodiments, the second male connector 598 is another type of male connector (e.g., a male mini USB connector, etc.) configured to interface with a corresponding female connector of the battery pack 500.

According to an exemplary embodiment, the first male connector 596 is configured to interface with a female connector of an electronic device (e.g., a smart phone, a tablet, a battery pack, a laptop, etc.). In one embodiment, the first male connector 596 is a male lightning connector configured to interface with a female lightning connector of an electronic device. In another embodiment, the first male connector 596 is a male micro USB connector configured to interface with a female micro USB connector of an electronic device. In still other embodiments, the first male connector 596 is another type of male connector (e.g., a male mini USB connector, a 30-pin connector, etc.) configured to interface with a corresponding female connector of an electronic device.

Figure 11E:
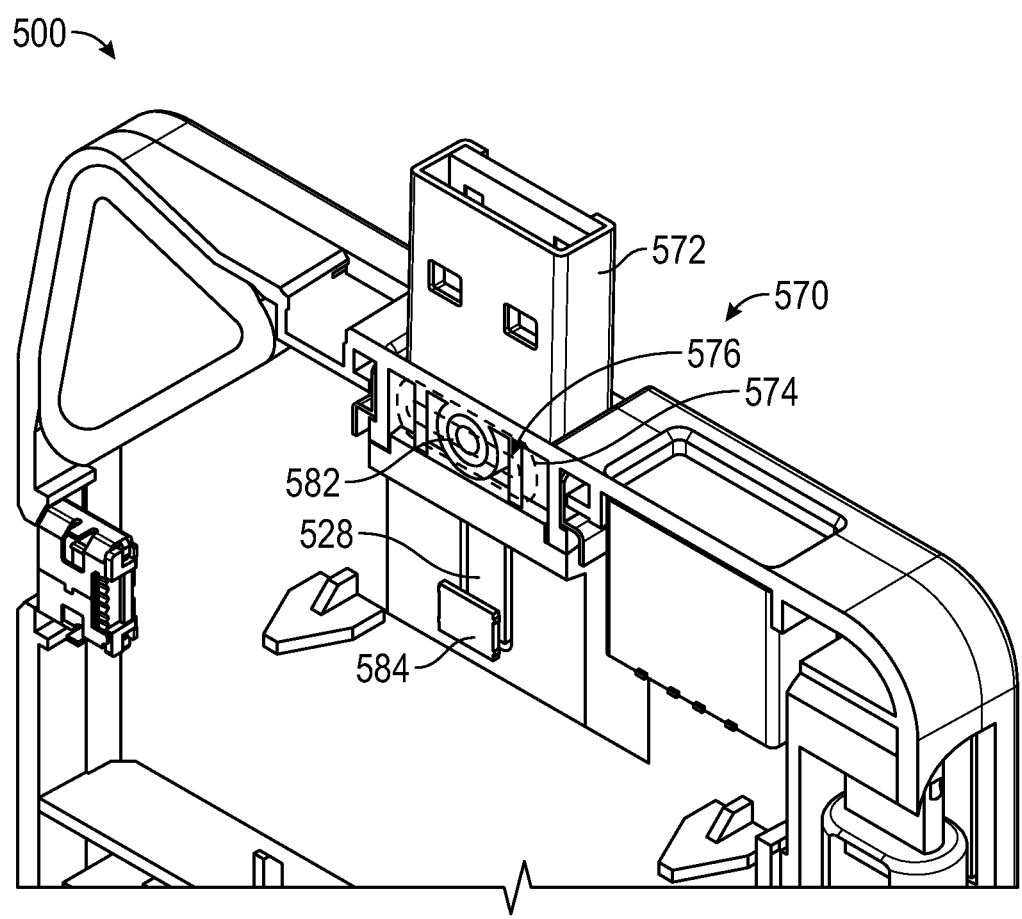

As shown in FIGS. 11B and 11D, the rear face 520 defines a cavity, shown as recess 526. According to an exemplary embodiment, the recess 526 is configured to receive the male connector 572 of the input interface 570. According to an exemplary embodiment, the male connector 572 is selectively repositionable between a charging orientation (as shown in FIGS. 11A-11E) and a storage orientation (e.g., where the male connector 572 is disposed and stored within the recess 526, etc.). As shown in FIGS. 11B and 11D-11E, the input interface 570 includes an indexer, shown as indexer 574, having a plurality of indentations, shown as depressions 576. As shown in FIGS. 11B and 11D, the battery pack 500 has a clip, shown as clip 528, disposed within the recess 526. As shown in FIG. 11E, the battery pack 500 includes a retainer, shown as pogo 582, and a user input device, shown as switch 584. As shown in FIG. 11E, the pogo 582 is positioned to engage the depressions 576 of the indexer 574. The clip 528 is positioned to interface with the switch 584. By way of example, the male connector 572 may be rotated from the charging orientation into the recess 526 to reconfigure the male connector 572 into the storage orientation. The pogo 582 may engage the depressions 576 of the indexer 574 as the male connector 572 is rotated. According to an exemplary embodiment, the pogo 582 engages the depressions 576 to hold the male connector 572 in a desired position (e.g., and thereby restrict inadvertent movement thereof, etc.). When the male connector 572 is further rotated into the recess 526, the male connector 572 engages (e.g., pushes on, etc.) the clip 528, which thereby causes the clip 528 to deform and engage the switch 584. The engagement of the switch 584 may trigger a display of a charge level of the battery pack 500. In other embodiments, engagement of the switch 584 and/or further rotation of the male connector 572 selectively locks the male connector 572 within the recess 526 and into a storage orientation. A user may press in on and/or pull on the male connector 572 to reconfigure the male connector 572 into the extended or use orientation.

Figure 10A:
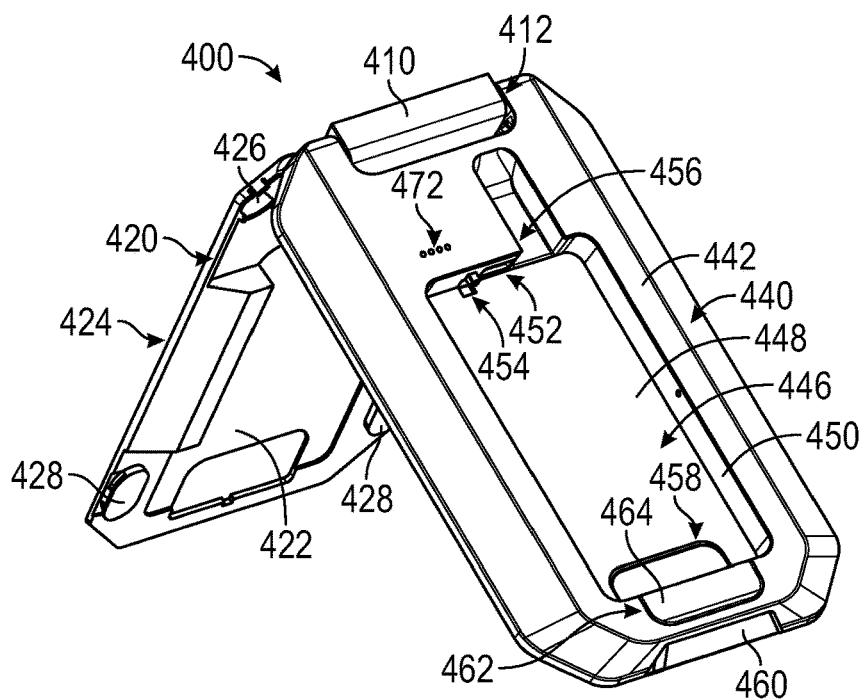
FIGS. 10A-10G are various views of the module of the solar panel assembly of FIG. 8, according to an exemplary embodiment.
Figure 10B:
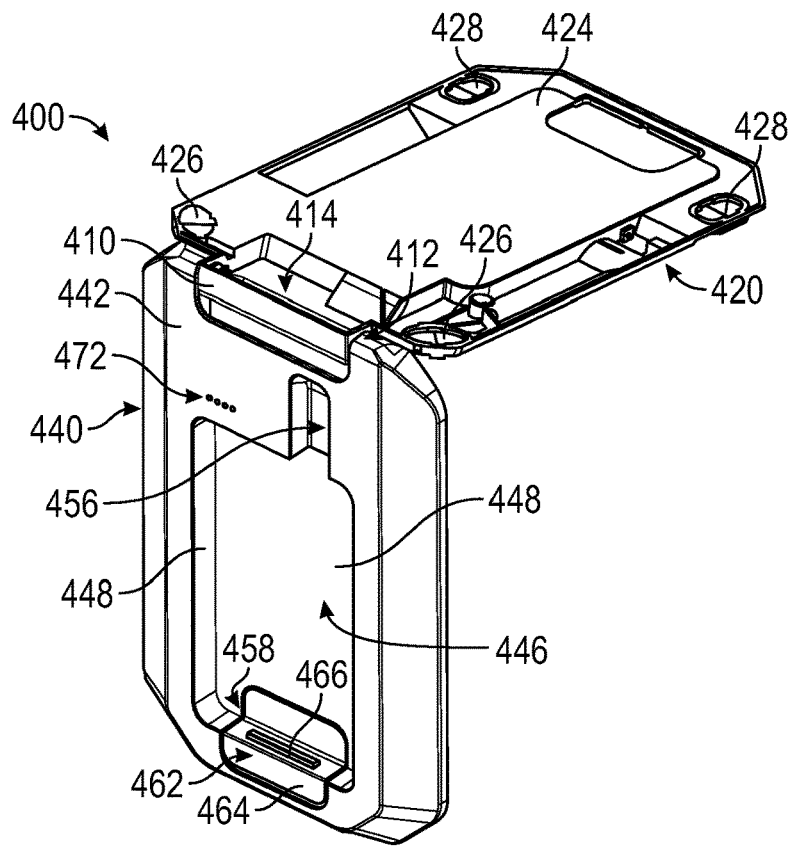
Figure 10D:
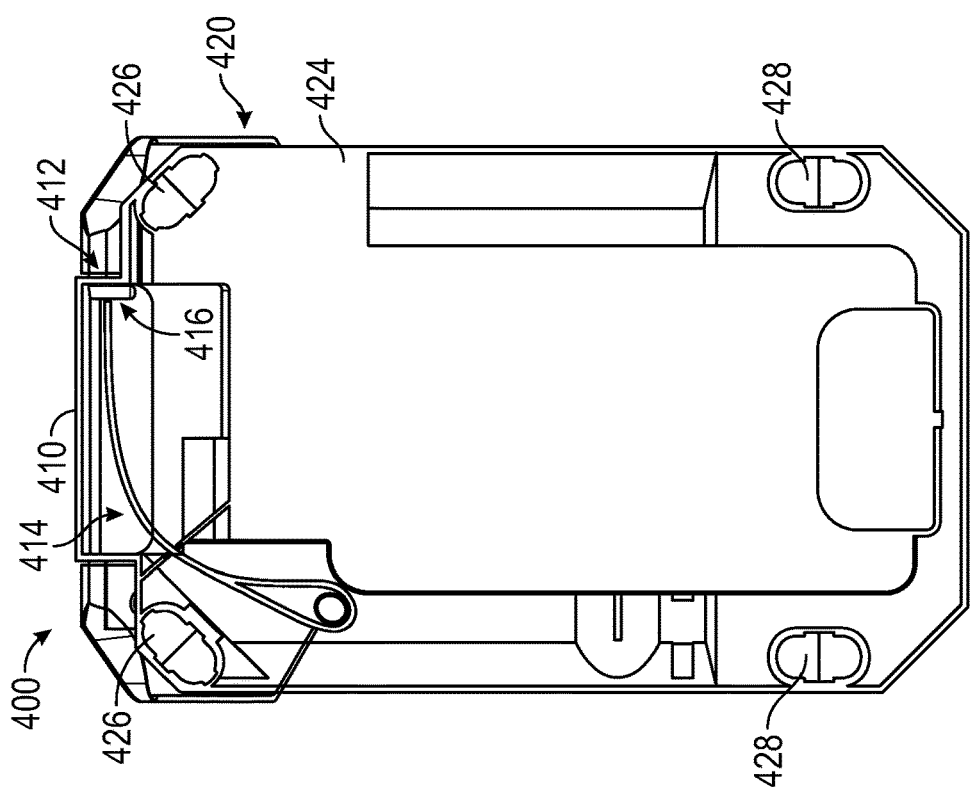
Figure 10C:
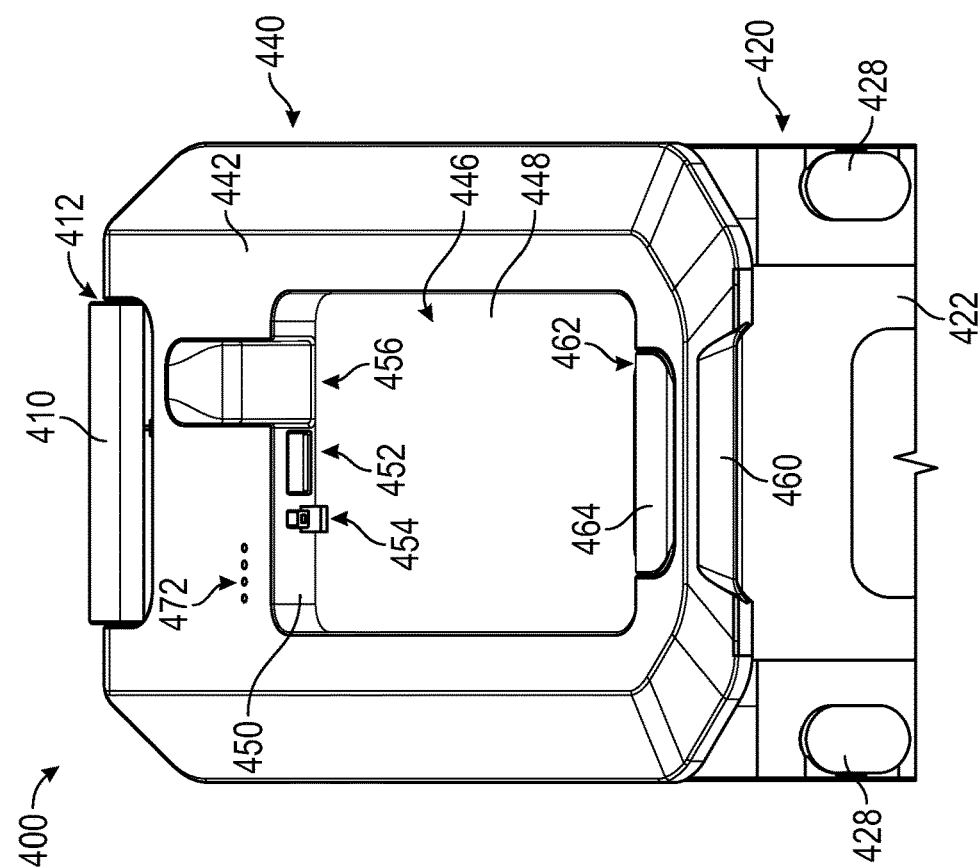

As shown in FIGS. 8-10C, the exterior side 442 of the kickstand 440 defines a cavity, shown as storage recess 446. According to an exemplary embodiment, the storage recess 446 and the battery pack 500 have corresponding shapes. As shown in FIGS. 8-9, the storage recess 446 is configured to receive and store the battery pack 500, coupling the battery pack 500 to the solar panel assembly 10. As shown in FIGS. 10A-10C, the storage recess 446 is defined by a surface of the kickstand 440, shown as back wall 448, and a wall of the kickstand 440, shown as peripheral wall 450. The peripheral wall 450 extends around the periphery of the back wall 448 and is shaped to correspond with the peripheral edge 540 of the battery pack 500, according to an exemplary embodiment. As shown in FIGS. 10A and 10C, a retainer, shown as retainer 454, is positioned along the top edge of the peripheral wall 450. According to an exemplary embodiment, the retainer 454 is positioned in corresponding relation with (e.g., the shape of, the location of, etc.) the retaining aperture 560 when the battery pack 500 is disposed within the storage recess 446. According to an exemplary embodiment, the retaining aperture 560 of the battery pack 500 is configured (e.g., shaped, etc.) to receive the retainer 454. Engagement of the retainer 454 within the retaining aperture 560 may at least partially hold the battery pack within the storage recess 446.

As shown in FIGS. 8-10C, the kickstand 440 defines an aperture, shown as release aperture 458. The release aperture 458 is configured to receive a mechanism, shown as release mechanism 462. As shown in FIG. 10B, the release mechanism 462 includes a button, shown as release button 464, and a retainer, shown as retainer 466. As shown in FIG. 10B, the retainer 466 is positioned along the bottom edge of the peripheral wall 450. According to an exemplary embodiment, the retainer 466 is positioned to cooperate with (e.g., the shape of, the location of, etc.) the retaining slot 562 when the battery pack 500 is disposed within the storage recess 446. According to an exemplary embodiment, the retaining slot 562 of the battery pack 500 is configured (e.g., shaped, etc.) to receive the retainer 466. According to an exemplary embodiment, the retainer 454 and the retainer 466 are configured to cooperatively selectively fix the battery pack 500 within the storage recess 446 (e.g., the release button 464 and the retainer 466 may be spring or otherwise biased into a locking position, etc.). According to an exemplary embodiment, the release button 464 facilitates releasing the battery pack 500 from the storage recess 446 (e.g., when a user presses the release button 464 to overcome the spring or other bias to disengage the retainer 466 from the retaining slot 562, etc.). By way of example, pressing the release button 464 while the battery pack 500 is selectively fixed with the storage recess 446 may cause the retainer 466 to disengage from the retaining slot 562, thereby allowing the battery pack 500 to be removed from the storage recess 446.

In some embodiments, the release mechanism 462 is configured to retract the retainer 454 and/or the retainer 466 when the release button 464 is pressed. The battery pack 500 may be inserted into engagement with the retainer 454 and pivoted into the storage recess 446 (e.g., overcoming the spring or other bias on the retainer 466 with the spring or other bias on the retainer thereafter holding the battery pack 500 in place, etc.).

As shown in FIGS. 10A, 10C, and 10G, the top edge of the peripheral wall 450 defines an aperture, shown as input aperture 452. According to an exemplary embodiment, the input aperture 452 is positioned to correspond with (e.g., the location of, etc.) and configured (e.g., shaped, etc.) to receive the male connector 572 of the input interface 570 when the battery pack 500 is disposed within the storage recess 446 (e.g., and the male connector 572 is in the charging orientation, etc.). In some embodiments, the input aperture 452 includes a corresponding female connector (e.g., a female USB connector, etc.) configured to receive the male connector 572 to facilitate charging the battery pack 500 with the solar panel assembly 10 while the battery pack 500 is disposed within the storage recess 446. As shown in FIGS. 8-10C, the exterior side 442 defines a cavity, shown as output cavity 456. According to an exemplary embodiment, the output cavity 456 is positioned to correspond with (e.g., the location of, etc.) the output interface 564 when the battery pack 500 is disposed within the storage recess 446. According to an exemplary embodiment, the output cavity 456 facilitates plugging a corresponding male connector (e.g., male USB connector, etc.) into the output interface 564 while the battery pack 500 is disposed within the storage recess 446. According to one embodiment, the output cavity 456 facilitates the removal of the battery pack 500 from the storage recess 446 while and/or after the release button 464 is pressed.

Figure 10E:
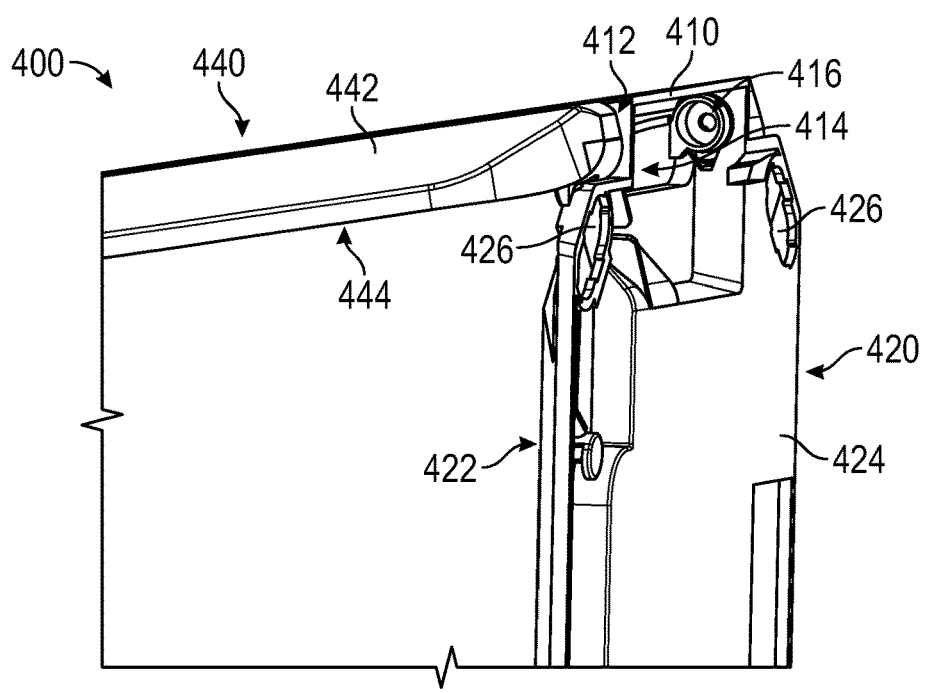
Figure 10F:
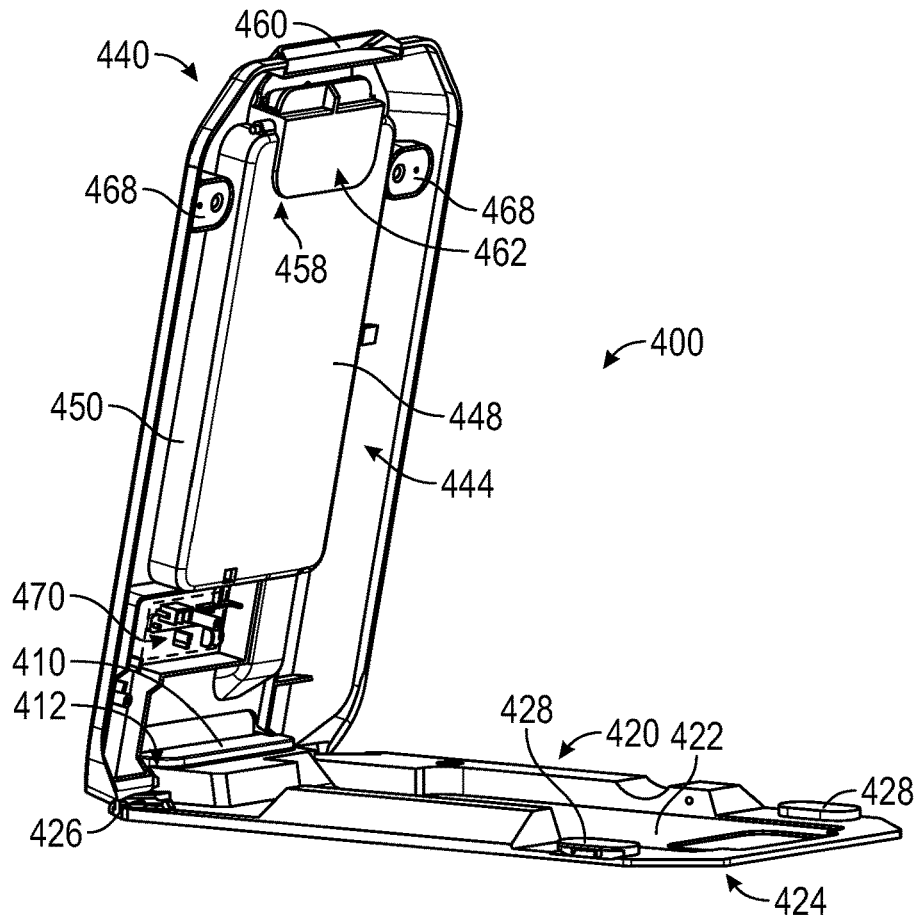
Figure 10G:
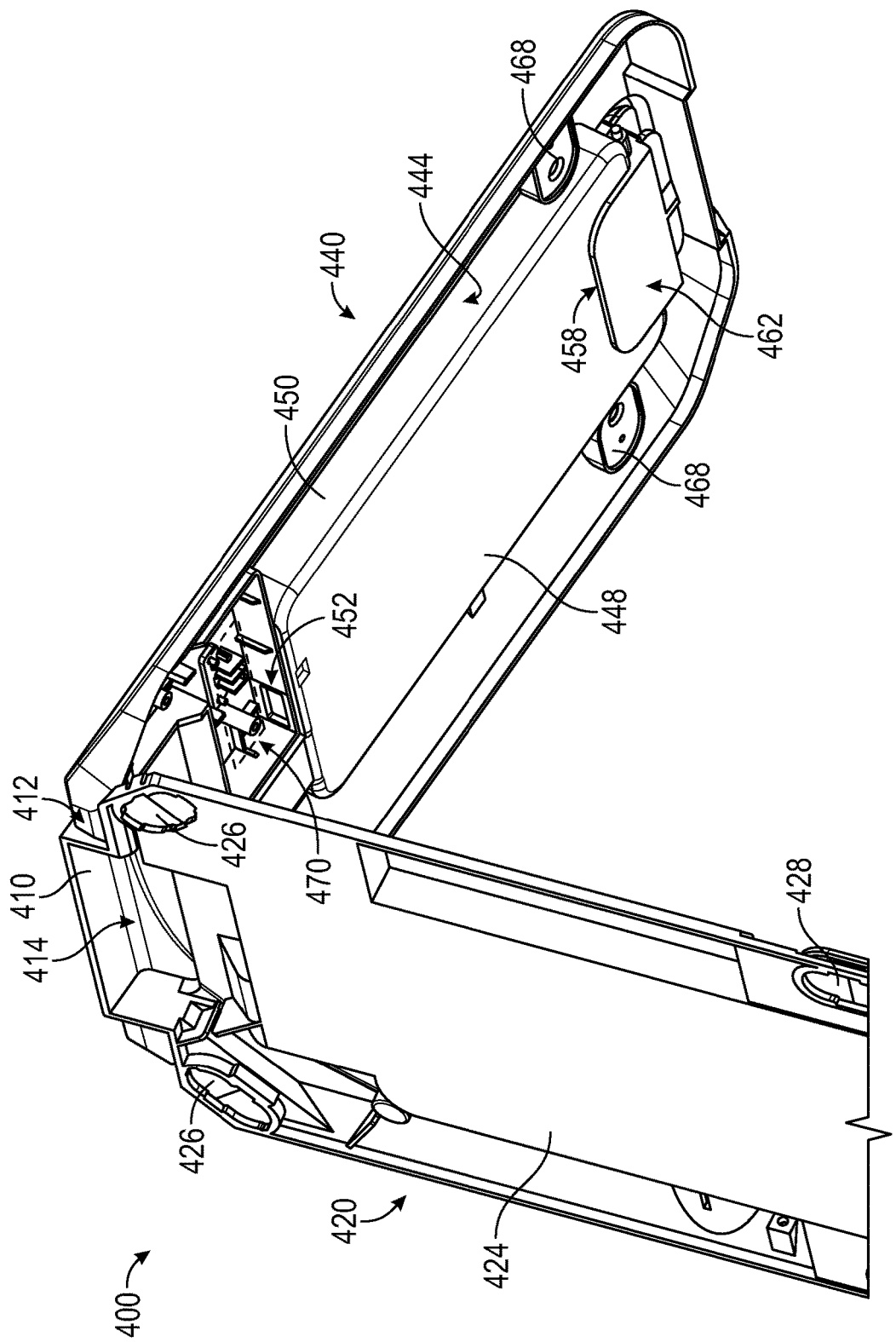

As shown in FIGS. 10B, 10D-10E, and 10G, the base 410 of the module 400 defines a cavity, shown as rear cavity 414. The rear cavity 414 is configured (e.g., shaped, positioned, etc.) to receive the output 100 (e.g., when the module 400 is coupled to the rear surface 14, etc.), according to an exemplary embodiment. As shown in FIGS. 10D-10E, the base 410 includes an interface, shown as input interface 416. According to an exemplary embodiment, the input interface 416 includes a female connector that corresponds with the male connector of the output connector 106 (e.g., a female barrel plug that receives a male barrel plug of the output connector 106, etc.). In alternative embodiments, the input interface 416 includes a male connector that corresponds with a female connector of the output connector 106.

As shown in FIGS. 10F-10G, the module 400 includes an output module, shown as output module 470, disposed along the interior side 444 of the kickstand 440. According to an exemplary embodiment, the output module 470 is coupled to the input interface 416, thereby coupling the solar cells 46 of the solar panel assembly 10 to the output module 470 (e.g., with the output 100, etc.). According to an exemplary embodiment, the output module 470 includes an output interface having a female connector (e.g., a female USB connector, etc.) configured to receive the male connector 572 extending through the input aperture 452 (e.g., when in the charging orientation, etc.) while the battery pack 500 is disposed within the storage recess 446. The output module 470 may receive power from the solar cells 46 and at least one of power and charge the battery pack 500 or other electronic device with the output interface disposed within the input aperture 452. In an alternative embodiment, the cable 104 is hard wired to the output module 470. In another alternative embodiment, the interior side 444 of the kickstand 440 defines a mounting or storage location that receives the output module 110. In some embodiments, the output module 110 is positioned such that the output interface of the output module 110 aligns with the input aperture 452 to receive the male connector 572 of the battery pack 500.

As show in FIGS. 8-10C, the output module 470 includes a display, shown as display 472. According to an exemplary embodiment, the display 472 is configured to indicate the intensity of the solar energy incident upon the front surface 12 of to the solar panel assembly 10 (e.g., providing a power flow indicator, etc.). According to an exemplary embodiment, the display 472 includes a plurality of LEDs. By way of example, as the solar intensity increases, the number of LEDs of the display 472 that illuminate may increase, providing an indication as to the solar intensity. In an alternative embodiment, the display 472 is or includes a digital display or any other type of display that provides an indication of the solar intensity. According to an exemplary embodiment, the display 472 is positioned such that a user of the solar panel assembly 10 may see the intensity of the incident solar energy and reorient the solar panel assembly 10 (e.g., rotate the solar panel assembly 10, adjust the angle of the kickstand 440, change the panel-to-sun placement, etc.) to achieve a maximum power output from the solar panel assembly 10. In still other embodiments, the solar panel assembly 10 is configured such that the display 472 indicates a charge level of the battery pack 500.

As utilized herein, the terms "approximately", "about", "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the terms "exemplary" and "example" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like, as used herein, mean the joining of two members directly or indirectly to one another. Such joining may be stationary (e.g., permanent, etc.) or moveable (e.g., removable, releasable, etc.). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," "between," etc.) are merely used to describe the orientation of various elements in the figures. It should be noted that the orientation of various elements may differ according to other exemplary embodiments, and that such variations are intended to be encompassed by the present disclosure.

It is important to note that the construction and arrangement of the solar panel assembly as shown in the exemplary embodiments is illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies of the components described herein may be constructed from any of a wide variety of materials that provide sufficient strength or durability, in any of a wide variety of colors, textures, and combinations. Accordingly, all such modifications are intended to be included within the scope of the present inventions. Other substitutions, modifications, changes, and omissions may be made in the design, operating conditions, and arrangement of the preferred and other exemplary embodiments without departing from scope of the present disclosure or from the spirit of the appended claims.

The invention claimed is:

1. A solar panel assembly, comprising:
a solar panel including a front surface, a rear surface, a top edge, a bottom edge, a left edge, a right edge, a first plurality of coupling elements disposed along the rear surface, and a plurality of solar cells provided along the front surface, the plurality of solar cells configured to absorb light energy from a light source to generate electrical power; and
a module releasably coupled to the solar panel, the module including:
a backer having a second plurality of coupling elements positioned to selectively engage with the first plurality of coupling elements to releasably couple the backer directly to the rear surface of the solar panel;
a support coupled to the backer and selectively repositionable relative to the backer and the rear surface of the solar panel between a first, stored orientation and a second, support orientation, wherein a free end of the support is spaced a distance from the rear of the solar panel and the backer when selectively repositioned in the second, support orientation such that the bottom edge of the solar panel and the free end of the support of the module cooperatively engage a surface to prop the solar panel in an upright orientation; and
a load device at least one of attached and attachable to the support and at least one of electrically coupled and able to be electrically coupled to the plurality of solar cells such that the module stores electrical energy produced by the plurality of solar cells.

2. The solar panel assembly of claim 1, wherein the support is disposed along the backer when selectively repositioned in the first, stored orientation.

3. The solar panel assembly of claim 1, wherein the solar panel defines a plurality of apertures along a periphery thereof.

4. The solar panel assembly of claim 1, wherein the solar panel defines a central axis dividing the solar panel into a first half and a second half, wherein the module is positioned on the first half of the solar panel, and wherein the solar panel is selectively foldable about the central axis.

5. The solar panel assembly of claim 1, wherein the support includes a pocket configured to receive at least one of the load device and a portable electronic device, the pocket positioned along an exterior surface of the support.

6. The solar panel assembly of claim 1, wherein the support defines a cavity configured to receive the load device, the cavity having a shape corresponding to the shape of the load device.

7. The solar panel assembly of claim 5, wherein the pocket includes a vented mesh layer that facilitates convective heat transfer from the at least one of the load device and the portable electronic device.

8. The solar panel assembly of claim 1, wherein the load device is releasably couplable to the support.

9. The solar panel assembly of claim 1, wherein the load device includes a power input connector comprising a male USB connector such that the load device is selectively rechargeable with a female USB connector.

10. The solar panel assembly of claim 9, wherein the load device includes a power output connector comprising a female USB connector.

11. The solar panel assembly of claim 9, wherein the support includes a power output connector comprising a female USB connector electrically coupled to the plurality of solar cells and positioned to receive the male USB connector of the load device.

12. A solar panel assembly, comprising:
a solar panel including a front surface, a rear surface, and a plurality of solar cells provided along the front surface, the plurality of solar cells configured to absorb light energy from a light source to generate electrical power; and
a module coupled to the solar panel, the module including a power output connector electrically coupled to the plurality of solar cells, the power output connector configured to facilitate at least one of selectively powering and selectively charging a load device with by the solar panel assembly,
wherein the module comprises an interior surface disposed along the solar panel and an opposing exterior surface separated from the interior surface by the module, wherein the module defines a cavity that is at least partially formed by the opposing exterior surface and not the interior surface, and wherein the cavity is configured to selectively receive the load device such that the load device is selectively deployable with the solar panel and the module.

13. The solar panel assembly of claim 12, wherein at least a portion of the module is selectively repositionable relative to the solar panel between a first orientation and a second orientation, wherein the interior surface of the portion of the module is disposed along at least one of the front surface and the rear surface of the solar panel when selectively repositioned in the first orientation.

14. The solar panel assembly of claim 13, wherein the interior surface of the portion of the module is spaced a distance from the at least one of the front surface and the rear surface of the solar panel, and wherein the portion of the module is configured to prop the solar panel in an upright position when selectively repositioned in the second orientation.

15. The solar panel assembly of claim 12, wherein the cavity is vented thereby facilitating convective heat transfer from the load device.

16. The solar panel assembly of claim 12, wherein the load device includes a power input connector comprising a male USB connector such that the load device is selectively rechargeable with a female USB connector.

17. The solar panel assembly of claim 16, the power output connector of the module is a first power output connector, wherein the load device includes a second power output connector comprising a female USB connector.

18. The solar panel assembly of claim 16, wherein the power output connector of the module includes a female USB connector electrically coupled to the plurality of solar cells and positioned to receive the male USB connector of the load device.

19. A solar panel assembly, comprising:
- a solar panel including a front surface, a rear surface, and a plurality of solar cells provided along the front surface, the plurality of solar cells configured to absorb light energy from a light source to generate electrical power;
- a power output connector electrically coupled to the plurality of solar cells, the power output connector extending from the rear surface of the solar panel, wherein the power output connector is configured to interface with at least one of a portable device and a load device to facilitate selectively powering the at least one of the portable electronic device and the load device; and
- a module releasably coupled to the solar panel, the module including a leg having a first end coupled to the module and a second, free end, wherein the leg is selectively repositionable relative to the solar panel between a retracted orientation and an extended orientation, and wherein the second, free end of the leg is spaced from the solar panel and the module to prop the solar panel upright when selectively repositioned into the extended orientation.

20. The solar panel assembly of claim 12, wherein the module includes a pocket positioned along the opposing exterior surface thereof that defines the cavity, the pocket including a fastener that facilitates selectively accessing the cavity.

* * * * *